(12) United States Patent
Roy

(10) Patent No.: US 11,889,654 B2
(45) Date of Patent: *Jan. 30, 2024

(54) SECURITY PANELS FOR USE IN DATA CENTERS

(71) Applicant: Switch, Ltd., Las Vegas, NV (US)

(72) Inventor: Rob Roy, Las Vegas, NV (US)

(73) Assignee: Switch, Ltd., Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,070

(22) Filed: Aug. 26, 2022

(65) Prior Publication Data

US 2022/0418152 A1    Dec. 29, 2022

Related U.S. Application Data

(63) Continuation of application No. 16/225,773, filed on Dec. 19, 2018, now Pat. No. 11,483,946.

(60) Provisional application No. 62/608,529, filed on Dec. 20, 2017.

(51) Int. Cl.
| | |
|---|---|
| *H05K 5/02* | (2006.01) |
| *H05K 7/20* | (2006.01) |
| *H05K 5/04* | (2006.01) |
| *H05K 7/14* | (2006.01) |

(52) U.S. Cl.
CPC ....... *H05K 7/20127* (2013.01); *H05K 5/0213* (2013.01); *H05K 5/04* (2013.01); *H05K 7/1497* (2013.01); *H05K 7/20709* (2013.01); *H05K 7/20745* (2013.01)

(58) Field of Classification Search
CPC ...... H05K 5/0213; H05K 5/04; H05K 7/1497; H05K 7/20127; H05K 7/20136; H05K 7/20145; H05K 7/20709; H05K 7/20745; H02B 1/565
See application file for complete search history.

(56) References Cited

U.S. PATENT DOCUMENTS

| | | | |
|---|---|---|---|
| 5,698,818 A | 12/1997 | Brench | |
| 5,895,885 A * | 4/1999 | Kunkel | ............... H05K 9/0041 174/385 |
| 6,348,653 B1 | 2/2002 | Cho | |
| 7,390,976 B2 | 6/2008 | Liang | |
| 8,072,752 B2 | 12/2011 | Wantschik | |
| 8,804,374 B2 | 8/2014 | Gilliland | |

(Continued)

*Primary Examiner* — Jacob R Crum
(74) *Attorney, Agent, or Firm* — Weide & Miller, Ltd.

(57) ABSTRACT

Disclosed is an integrated data center that provides for efficient cooling as well as efficient wire routing. The data center houses electronic equipment stored in clusters of cabinets. The space inside the data center is shared, such as on a leased basis, between multiple different entities who operate their own electronic equipment. To achieve privacy, security, and cooling air flow, one or more layers of a security paneling surround one or more clusters of cabinets to create a secure interior space. This allows access to only authorized personal, prevents people from viewing into the secure interior space, and allows cooling air flow to pass into the secure interior space to cool the electronic equipment. The security paneling comprises sheets of metal with small apertures. Two or more security panels may be arranged with offset apertures to further prevent viewing of the electronic equipment in the secure interior space.

19 Claims, 23 Drawing Sheets

(56) References Cited

U.S. PATENT DOCUMENTS

| | | | | |
|---|---|---|---|---|
| 2004/0223300 A1* | 11/2004 | Fink | ............... | H05K 7/20 |
| | | | | 361/690 |
| 2008/0174954 A1* | 7/2008 | VanGilder | ............... | H05K 7/20745 |
| | | | | 361/679.54 |
| 2008/0212265 A1 | 9/2008 | Mazura | | |
| 2009/0293136 A1* | 11/2009 | Campbell | ............... | G08B 13/19 |
| | | | | 726/34 |
| 2011/0128697 A1 | 6/2011 | Schott | | |
| 2011/0316337 A1* | 12/2011 | Pelio | ............... | H05K 7/1492 |
| | | | | 307/24 |
| 2012/0009862 A1* | 1/2012 | Meyer | ............... | H05K 7/20745 |
| | | | | 454/184 |
| 2012/0167670 A1* | 7/2012 | Bean, Jr. | ............... | G01M 3/04 |
| | | | | 73/40.5 R |
| 2015/0049431 A1 | 2/2015 | Kondo | | |
| 2015/0123562 A1* | 5/2015 | Adriaenssens | ............... | H05B 47/105 |
| | | | | 315/291 |
| 2015/0230364 A1* | 8/2015 | Wands | ............... | H05K 7/20745 |
| | | | | 454/184 |
| 2015/0237768 A1 | 8/2015 | Endo | | |
| 2016/0113156 A1 | 4/2016 | Varreiter | | |
| 2017/0127574 A1 | 5/2017 | Heim | | |
| 2017/0244226 A1 | 8/2017 | Rajauria | | |
| 2017/0337337 A1* | 11/2017 | Heckerman | ............... | G16H 40/20 |
| 2018/0082040 A1 | 3/2018 | Teoh | | |
| 2019/0132996 A1* | 5/2019 | Skoglund | ............... | H05K 7/20172 |

\* cited by examiner

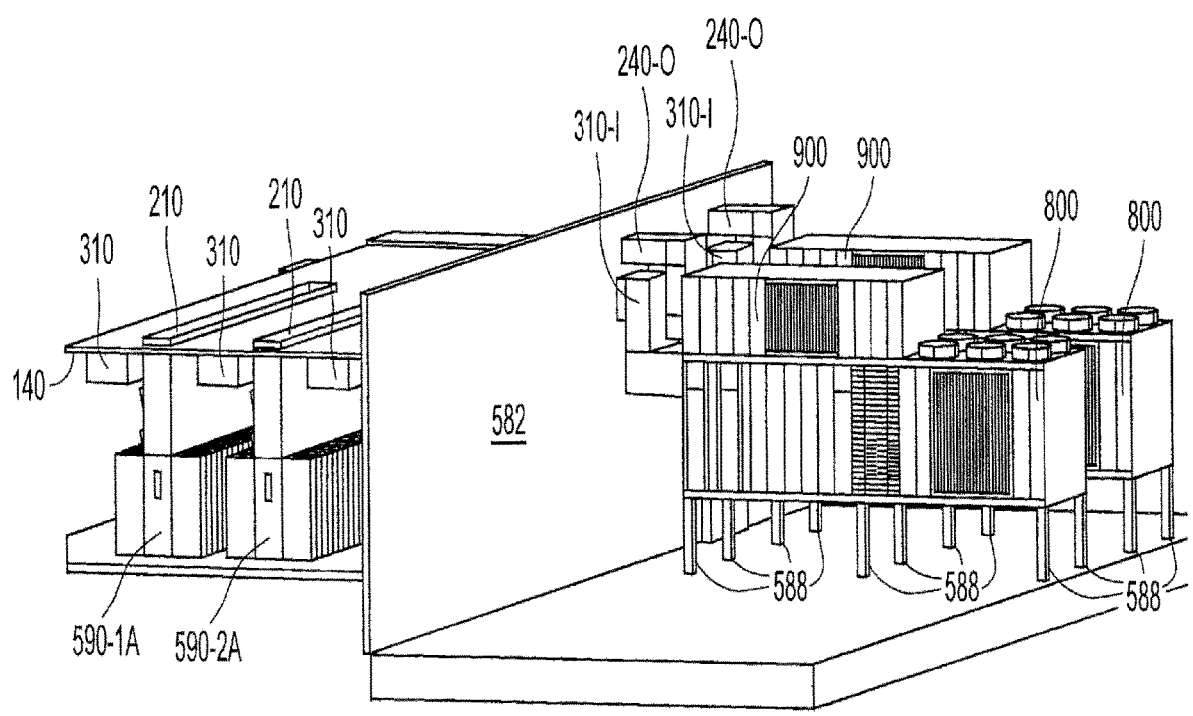
FIG. 5B1

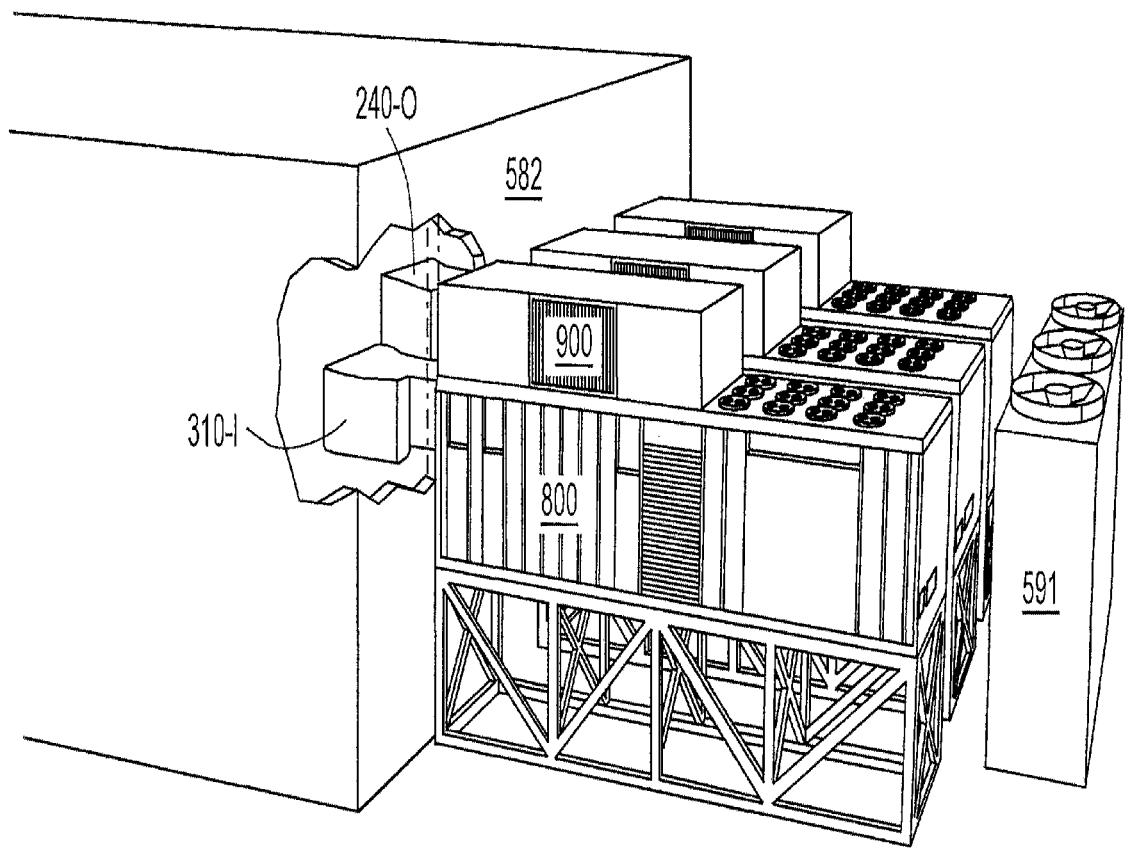
FIG. 5B2

SECURITY PANELS FOR USE IN DATA CENTERS

BACKGROUND

1. Field of the Invention

The disclosed embodiments relate to electronic equipment data centers or co-location facility designs and methods of making and using the same in an environmentally aware manner.

2. Background of the Invention

Data centers and server co-location facilities are well-known. In such facilities, rows of electronics equipment, such as servers, typically owned by different entities, are stored. In many facilities, cabinets are used in which different electronics equipment is stored, so that only the owners of that equipment, and potentially the facility operator, have access therein. In many instances, the owner of the facilities manages the installation and removal of servers within the facility, and is responsible for maintaining utility services that are needed for the servers to operate properly. These utility services typically include providing electrical power for operation of the servers, providing telecommunications ports that allow the servers to connect to transmission grids that are typically owned by telecommunication carriers, and providing air-conditioning services that maintain temperatures in the facility at sufficiently low levels for reliable operation.

There are some well-known common aspects to the designs of these facilities. For example, it is known to have the electronic equipment placed into rows, and further to have parallel rows of equipment configured back-to back so that each row of equipment generally forces the heat from the electronic equipment toward a similar area, known as a hot aisle, as that aisle generally contains warmer air that results from the forced heat from the electronics equipment. In the front of the equipment is thus established a cold aisle.

There are different systems for attempting to collect hot air that results from the electronics equipment, cooling that hot air, and then introducing cool air to the electronics equipment. These air-conditioning systems also must co-exist with power and communications wiring for the electronics equipment. Systems in which the electronics equipment is raised above the floor are well-known, as installing the communications wiring from below the electronics equipment has been perceived to offer certain advantages. Routing wiring without raised floors is also known—though not with systematic separation of power and data as described herein.

In the air conditioning units that are used in conventional facility systems, there are both an evaporator unit and a condenser unit. The evaporator units are typically located inside a facility and the condenser units are typically disposed outside of the facility. These units, however, are not located in standardized, accessible and relatively convenient positions relative to the facility should any of the units need to be accessed and/or removed for repair or replacement. Further, these units are not themselves created using an intentionally transportable design.

SUMMARY

The present invention provides an integrated data center that provides for efficient cooling, as well as efficient wire routing.

In one aspect is provided a facility with an internal area and an external area in an external environment for maintaining electronic equipment disposed in a plurality of cabinet clusters in the internal area at a cool temperature, the facility comprises:

a building that includes an exterior load wall separating the internal area and the external area;

a plurality of exterior wall openings in the exterior load wall;

a floor within the internal area of the building on which the plurality of cabinet clusters are disposed;

a plurality of cabinets for holding the electronic equipment therein, the plurality of cabinets positioned in a plurality of rows within each of a plurality of cabinet clusters so that the electronic equipment disposed within the cabinets emit heated air from the cabinets in each row of each cabinet cluster toward a central hot air area associated with each cabinet cluster;

a plurality of support brackets within each cabinet cluster, disposed along each of the plurality of rows, that together provide support for distribution power wiring and conduits, electronic equipment power wiring and conduits, and communication wiring, wherein a portion of each of the support brackets is disposed above the plurality of cabinets within each cabinet cluster, and wherein some of the distribution power wiring and conduits string across other cabinets in other cabinet clusters;

a thermal shield supported by the at least some of the plurality of support brackets, the thermal shield providing a contiguous wall around the central hot air area and defining a hot air containment chamber that traps the heated air within the central hot air area and causes substantially all the heated air within the central hot air area to rise up within the hot air containment chamber;

a plurality of air conditioning units disposed in the external area outside the building that each receive heated air, emit cooled air, and emit vented air, wherein the vented air is released into the external environment;

a warm air escape gap within the building disposed above the hot air containment chamber, the warm air escape channel feeding the heated air to the plurality of air conditioning units, the warm air escape gap being lowerly bounded by a false ceiling;

cool air ducts within the building that couple the plurality of air conditioning units and the cold aisles, the cool air ducts being disposed below the false ceiling and delivering cool air from the plurality of air conditioning units toward the plurality of rows of cabinets within each of the plurality of cabinet clusters; and warm air connectors and cool air duct connectors that respectively connect the warm air escape channel and the cold air ducts to the plurality of air conditioning units, and which pass through the plurality of exterior wall openings.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIGS. 5B1 and 5B2 illustrate cut-away perspective views of an exterior and interior portion of the data center or co-location facility according to other embodiments of the present invention.

DETAILED DESCRIPTION OF EMBODIMENTS

The present invention provides data center or co-location facility designs and methods of making and using the same. The data center or co-location facility designs have certain features that will be apparent herein and which allow many advantages in terms of efficient use of space, efficient modular structures that allow for efficiency in the set-up of co-location facility and the set-up of the electronics equipment in the facility, as well as efficient air-conditioning within the facility. Each of these features has aspects that are distinct on their own, and combinations of these features also exist that are also unique.

Figure 1A:
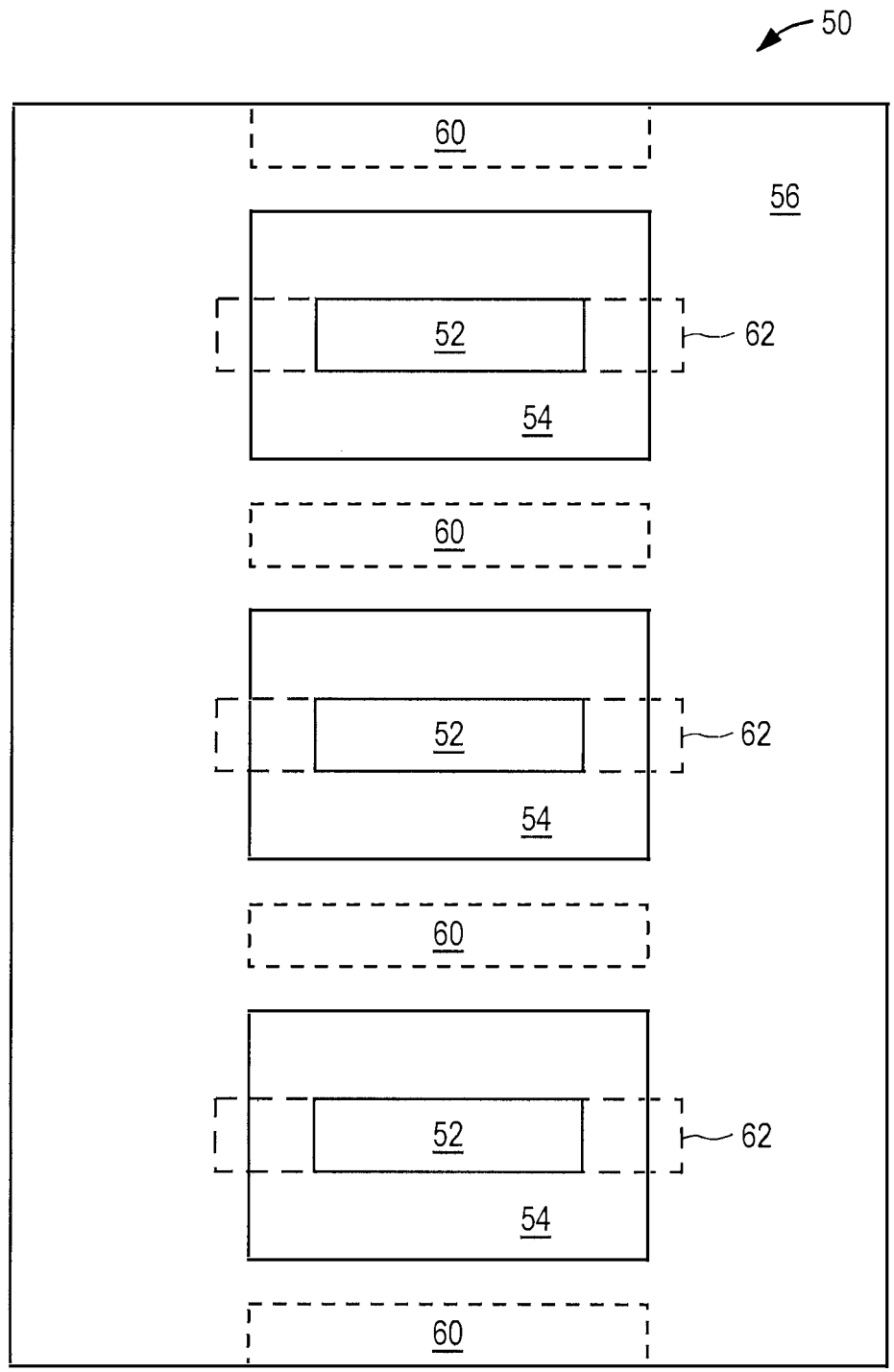
FIG. 1A illustrates a floor design used in a data center or co-location facility according to the present invention.

FIG. 1A illustrates a floor design used in a data center or co-location facility according to the present invention. The preferred embodiment discussed herein uses parallel rows of equipment configured back-to back so that each row of equipment generally forces the heat from the electronic equipment towards a hot aisle, thus also establishing a cold aisle in the front of the equipment. The cold aisles in FIG. 1A are illustrated at the dotted line block 60, wherein the hot aisles are illustrated at the dotted line block 62. One feature of the present invention is the provision for marking the floor 50 to explicitly show the various areas of the facility. As illustrated, the hot aisle 62 has a central area 52 that is tiled, painted, taped or otherwise marked to indicate that it is center area of the hot aisle 62, also referred to as a central hot air area. The typical dimensions of the central area 52 are typically in the range of 2'-4' across the width, with a row length corresponding to the number of electronic cabinets in the row. Marking with tiles is preferable as the marking will last, and tiles that are red in color, corresponding to the generation of heat, have been found preferable. Around this center area 52 is a perimeter area 54, over which the cabinets are installed. This perimeter area 54 is marked in another manner, such as using a grey tile that is different in color from the center area 52. Around the perimeter area 54 is an outside area 56, which is marked in yet a different manner, such as using a light grey tile. The placement of these markings for areas 52, 54 and 56 on the floor of the facility, preferably prior to moving any equipment onto the floor, allows for a visual correspondence on the floor of the various hot and cold aisles. In particular, when installing cabinets over the perimeter 54 are, the area that is for the front of the cabinet that will face the cold aisle, and thus the area for the back of the cabinet for the hot aisle, is readily apparent.

Figure 1B:
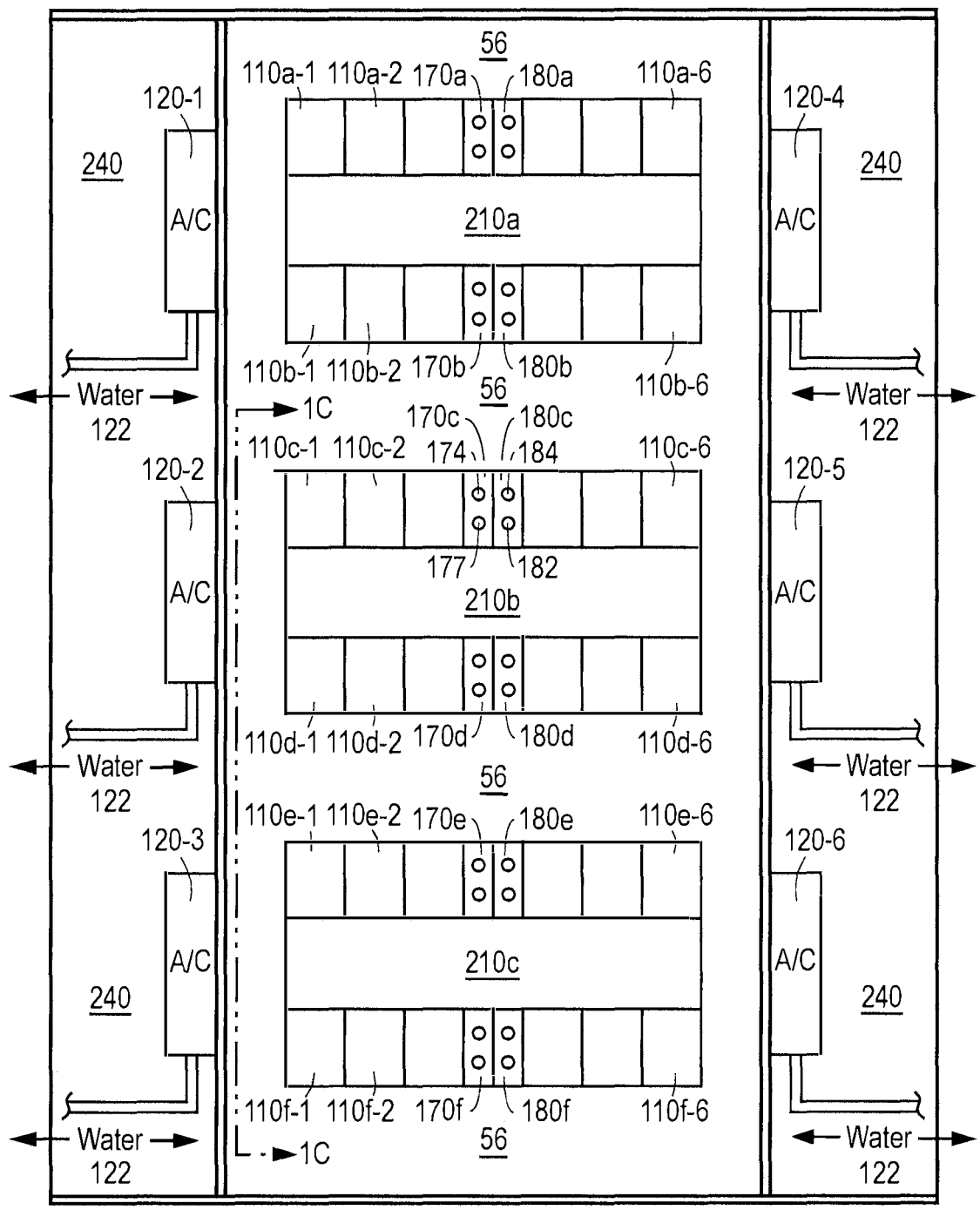
FIG. 1B illustrates floor-based components disposed over the floor design according to the present invention.

FIG. 1B illustrates floor-based components disposed over the floor design of the co-location facility according to the present invention. FIG. 1B also shows additional area of the floor, which in this embodiment is provided to illustrate interaction of the electronics equipment with the evaporators of the air conditioning units. In the embodiment described with respect to FIG. 1B, certain features are included so that conventional equipment, particularly conventional air conditioning equipment, can effectively be used while still creating the desired air flow patterns of the present invention as described herein.

Before describing the components in FIG. 1B, an aspect of the present invention is to isolate the hot air exhaust from the areas that require cooling as much as possible, and to also create air flows in which the air moves through the exhaust system, into the air conditioning system, through the air conditioning ducts and out to the cool equipment in a very rapid manner. In particular, the amount of circulation established according to the present invention moves air at a volume such that the entire volume of air in the facility recirculates at least once every 1 0 minutes, preferably once every 5 minutes, and for maximum cooling once every minute. It has been found that this amount of recirculation, in combination with the air flows established by the present invention, considerably reduce the temperature in the facility in an environmentally efficient manner.

Cabinets 110 shown in FIG. 1B are placed generally over the sides of the perimeter 54 as described, in rows. Different rows are thus shown with cabinets 110(a-f), with each letter indicating a different row. Also included within the rows are telecommunications equipment I 70 to which the electronics equipment in each of the cabinets 110 connect as described further herein, as well as power equipment I 80, containing circuit breakers as is known to protect against energy spikes and the like, that is used to supply power along wires to the electronics equipment in each of the cabinets I I 0 connect as described further herein. Air conditioning units include the evaporator units I 20 (I-6) that are shown being physically separated by some type of barrier from the area 56 described previously with respect to FIG. 1A. The condenser units of the air conditioning system that receive the warmed refrigerant/water along lines I 22 and are disposed outside the walls of the facility are not shown. This physical separation is implemented in order to establish warm exhaust channel area 240 separate from the physical space, which warm air area will connect to a separate warm air area in the ceiling and allow the warm air to flow into the exhaust channel area 240 and enter into intake ducts of evaporator air conditioning equipment I 20, as will be described. This feature allows the usage of conventional evaporator air conditioning equipment that has air intakes at the bottom of the unit, as well as allows for usage of different air conditioning equipment types, while still maintaining an efficient airflow throughout the entire facility.

Figure 1C:
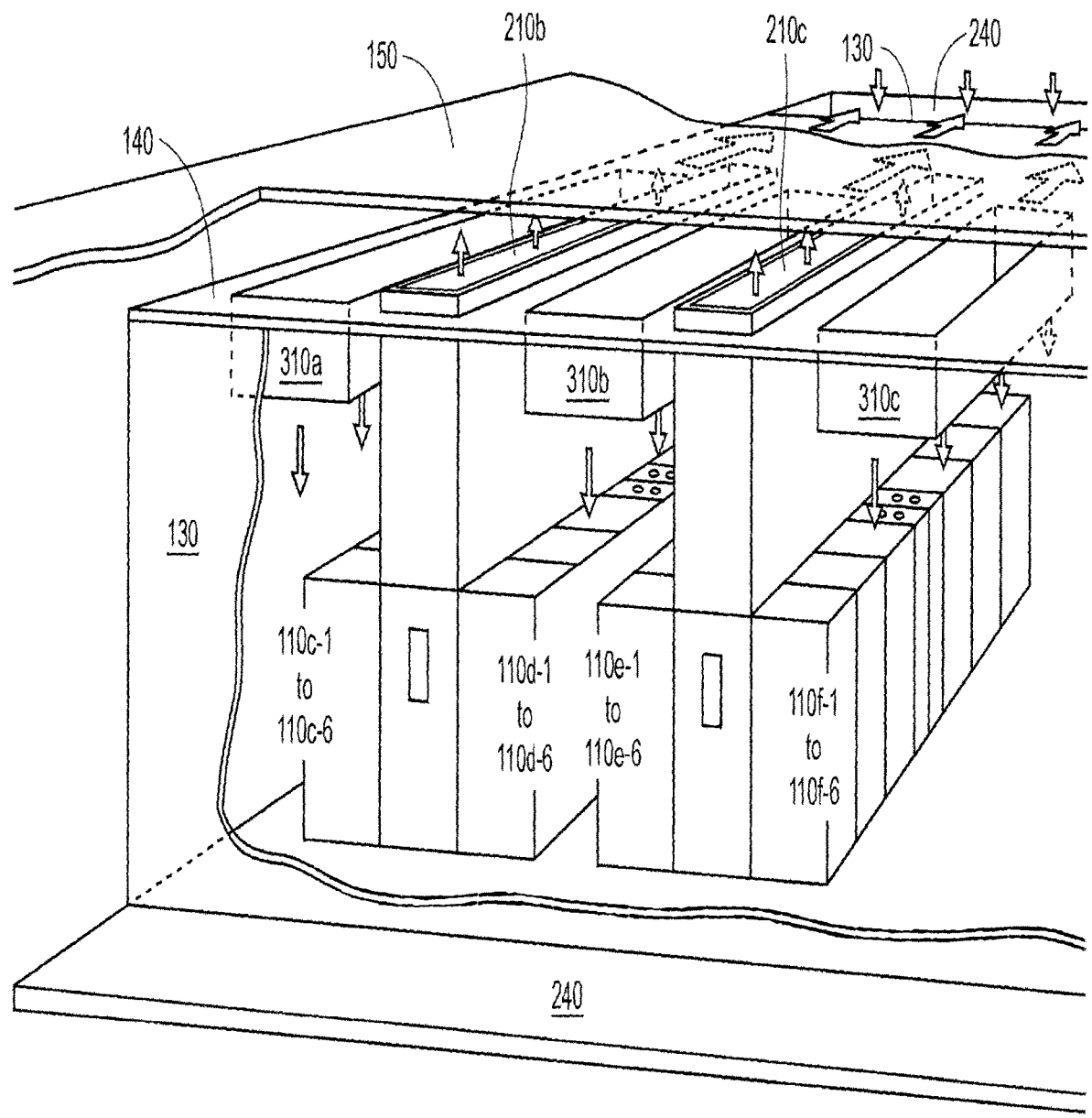
FIG. 1C illustrates a perspective cut-away view along line c-c from FIG. IA of FIG. IA according to the present invention.

FIG. 1C illustrates a perspective cut-away view along line c-c from FIG. 1A of the FIG. 1A co-location facility according to the present invention. Additionally, illustrated are the false ceiling I 40 and the actual ceiling I 50, which have a gap that is preferably at least 1.5-3 feet and advantageously at least I 5 feet, as the higher the ceiling the more the warm air rises (and thus also stays further away from the equipment in the cabinets I I 0). The false ceiling I 40 is preferably made of tiles that can be inserted into a suspended ceiling as is known, which tiles preferably have are drywall vinyl tiles, which exhibit a greater mass than many conventional tiles. Also shown are arrows that illustrate the air flow being centrally lifted upward from the hot air area containment chamber 210 formed by the thermal shields 400 to the area between the false ceiling 140 and the actual ceiling 150, and the flow within the ceiling toward the warm exhaust channel area 240, and then downward into the warm exhaust channel area 240 with the wall 130 separating the area 56 and the warm exhaust channel area 240. Also shown are arrows that take cold air from the cold air ducts 310 and insert the air into the cold aisles 60.

Though the arrows in the drawing are directed straight downward, the vents themselves can be adjusted to allow for directional downward flow at various angles. In a preferred embodiment, each of the vents have a remote controlled actuator that allows for the offsite control of the vents, both in terms of direction and volume of air let out of each vent. This allows precise control such that if a particular area is running hot, more cold air can be directed thereto, and this can be detected (using detectors not shown), and then adjusted for offsite.

Figure 2A:
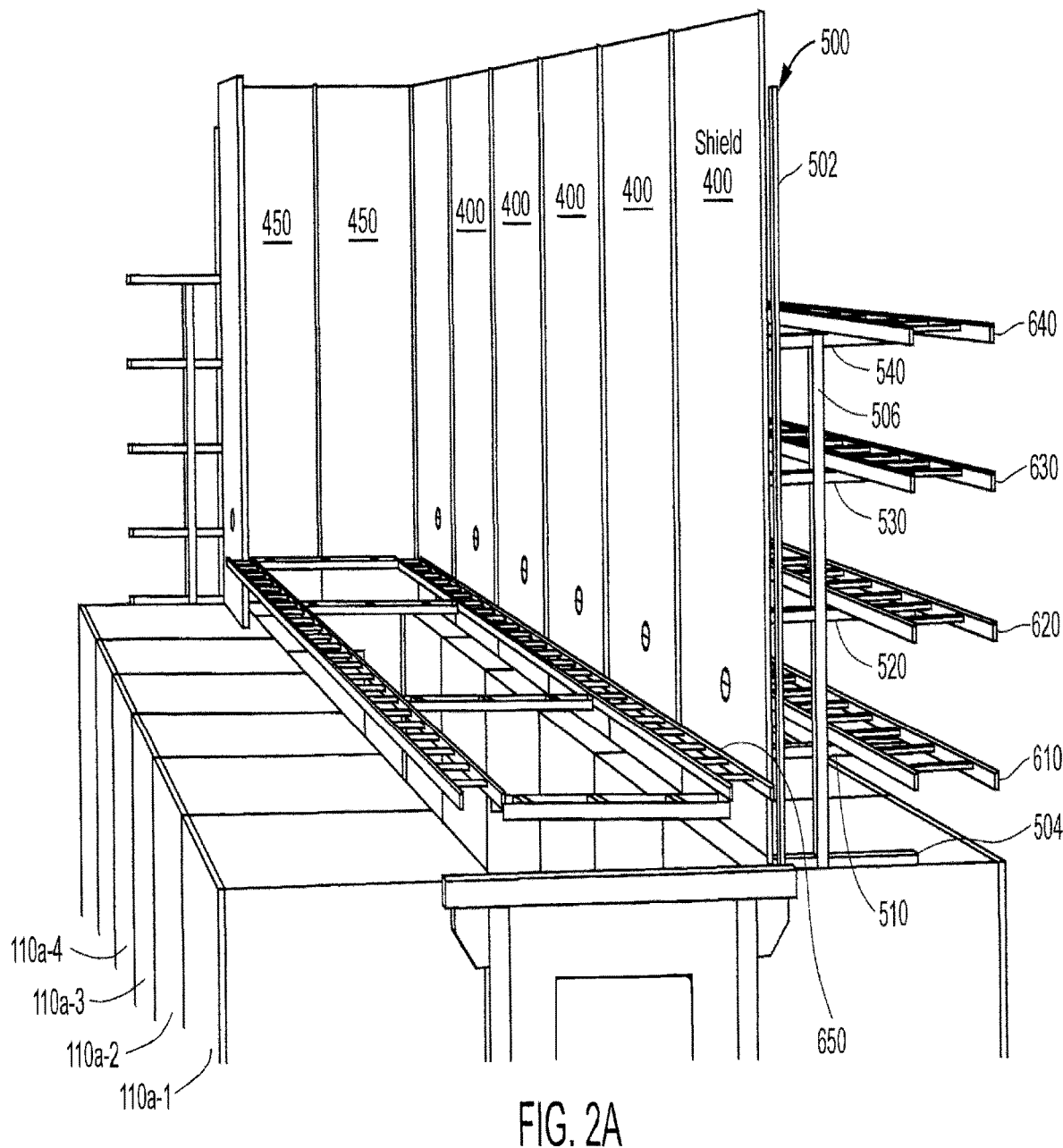
FIGS. 2A-2C illustrate various cut-away perspective views of the thermal compartmentalization and cable and conduit routing system according to the present invention.
Figure 2B:
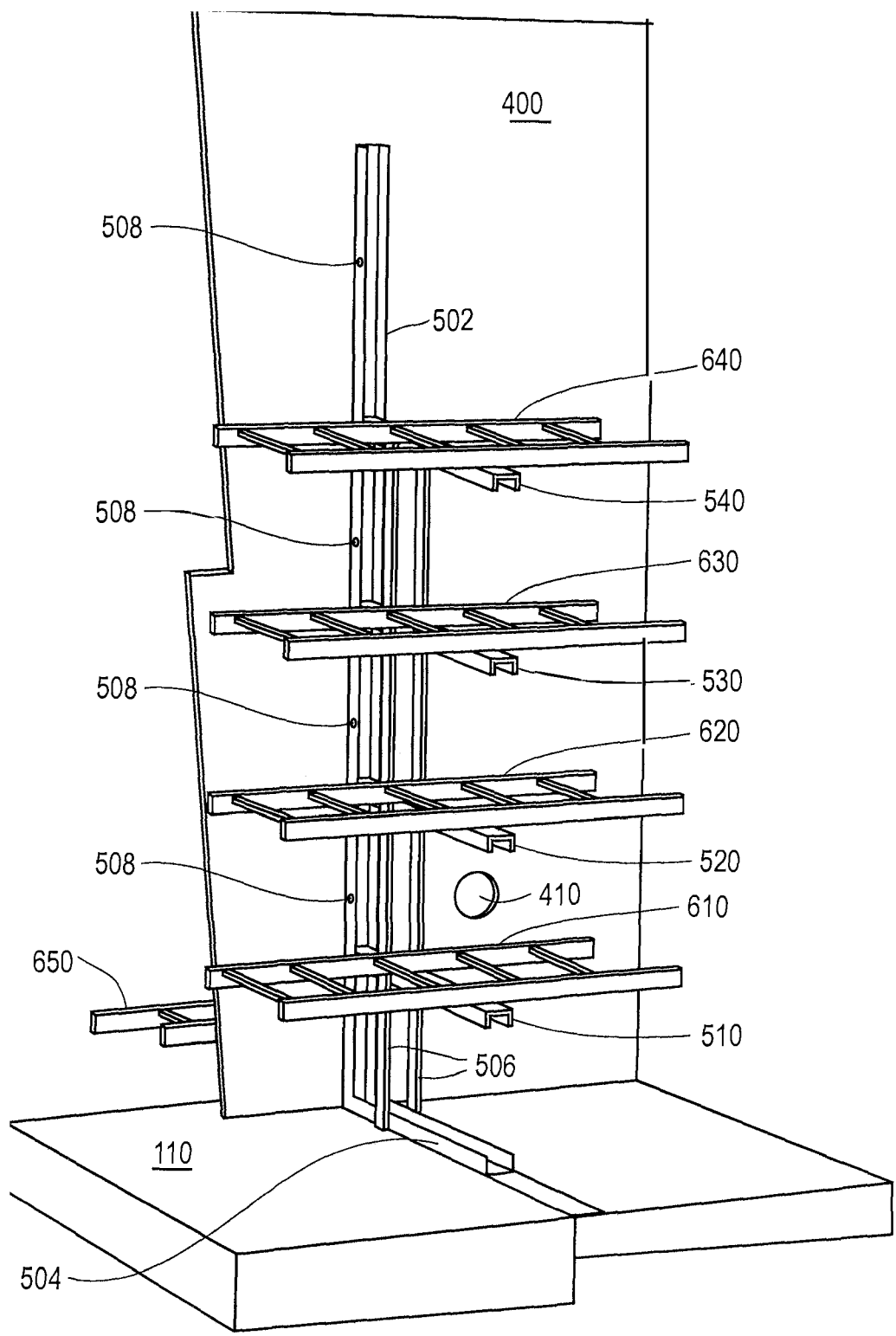
Figure 2C:
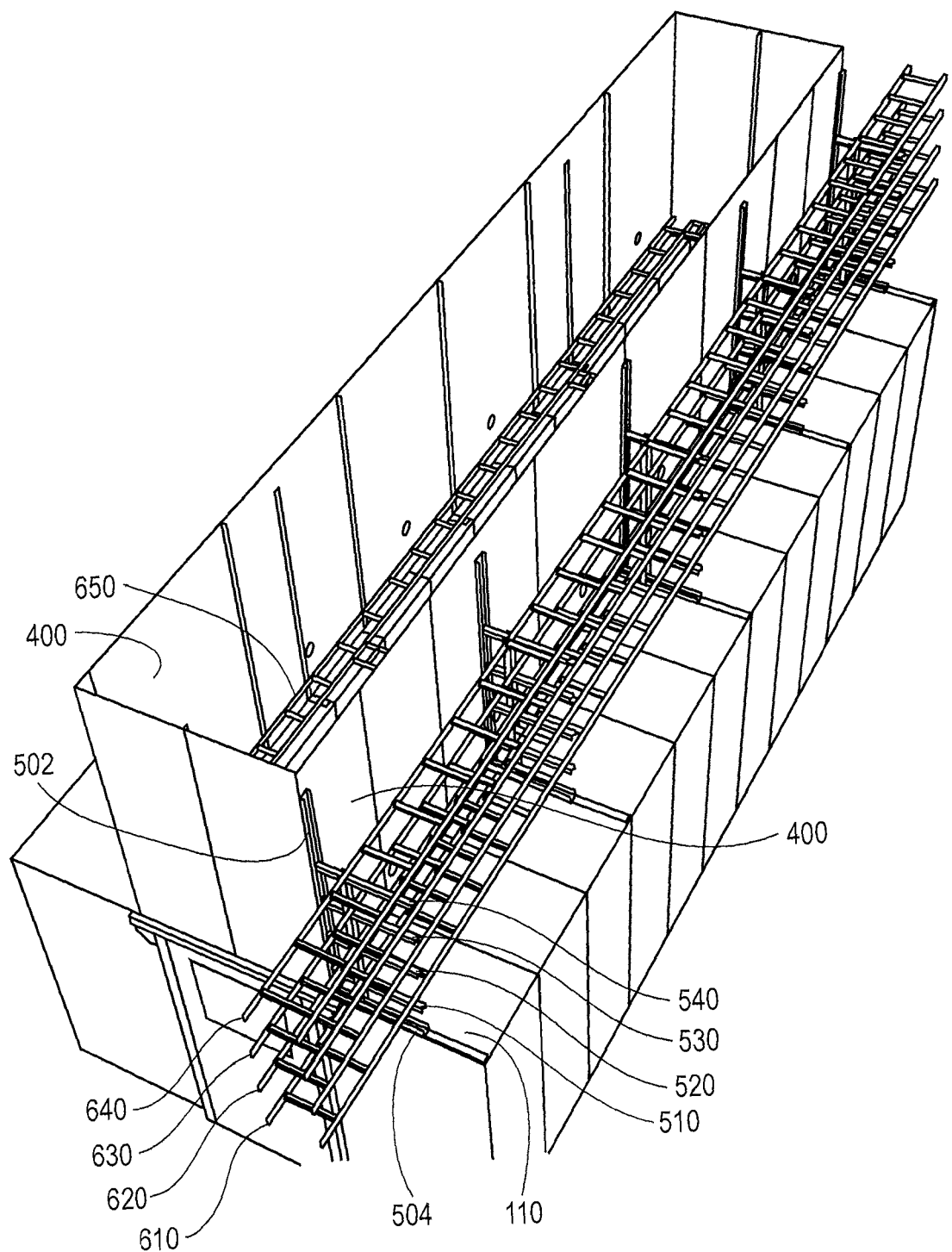

FIGS. 2A-2C illustrate various cut-away perspective views of the thermal compartmentalization and cable and conduit routing system according to the present invention. In particular, FIG. 2A illustrates a cut away view of a portion of the hot air area containment chamber 210, which rests on top of the cabinets 110, and is formed of a plurality of the thermal shields 400 and 450, which are modular in construction and will be described further hereinafter. Also illustrated are shield brackets 500 that are mounted on top of the cabinets 110, and provide for the mounting of the shields 400 and 450, as well as an area on top of the cabinets 110 to run power and telecommunications cables, as will be described further herein.

Figure 4:
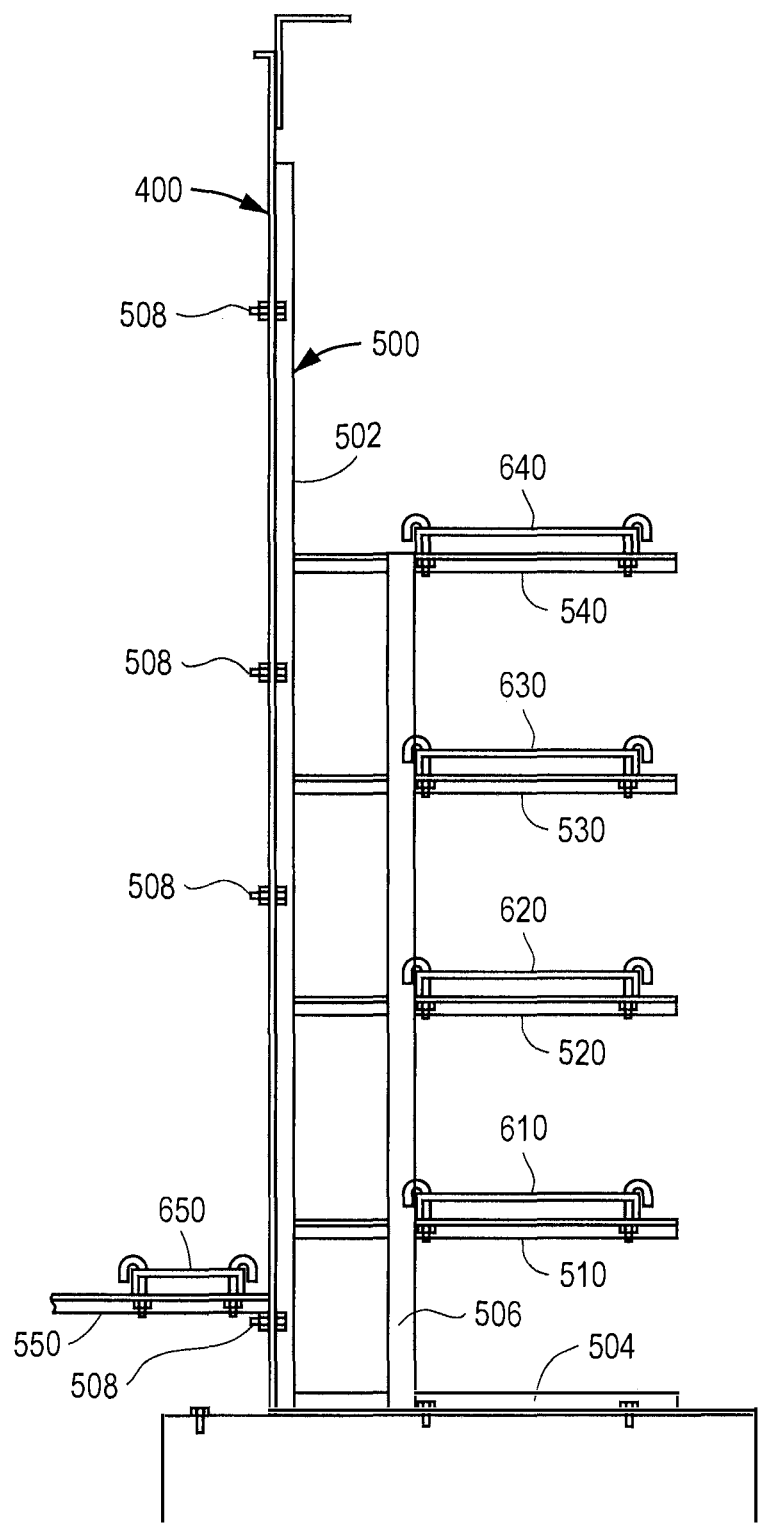
FIG. 4 illustrates illustrate a telecommunication bracket used in the thermal compartmentalization and cable and conduit routing system according to the present invention.

Before describing the cabling, FIG. 2B and FIG. 4 illustrate the shield and cabling support bracket 500, which is made of structurally sound materials, such as steel with a welded construction of the various parts as described, molded plastic, or other materials. Ladder rack supports 510, 520, 530, 540 and 550 are attached to back vertical support 502 of the shield and cabling support bracket 500 and used to allow ladder racks 610, 620, 630, 640, and 650 respectively, placed thereover as shown. The ladder racks are intended to allow for a segregation of data and electrical power, and therefore an easier time not only during assembly, but subsequent repair. The ladder racks are attached to the ladder rack supports using support straps shown in FIG. 4, which are typically a standard "j" hook or a variant thereof. As also illustrated in FIG. 4, a support beams structure 506 provides extra support to the ladder rack, and the holes 508 are used to secure the shields 400 and 450 thereto. Horizontal support plate 504 is used to support the support bracket 500 on the cabinets 110.

With respect to the cabling and conduit, these are used to provide electrical power and data to the various servers in the facility. Conduit, containing wiring therein, is used to provide electricity. Cabling is used to provide data. In this system, it is preferable to keep the electrical power and the data signals separated.

Within the system, ladder rack 610 is used for data cabling on the cold aisle side of the thermal shields 400. Ladder rack 620 is used for an A-source power conduit (for distribution of 110-480 volt power) on the cold aisle side of the thermal shields 400. Ladder rack 630 is used for B-source power conduit (for distribution of 110-480 volt power), which is preferably entirely independent of A-source power conduit, on the cold aisle side of the thermal shields 400. Ladder rack 640 is used for miscellaneous cabling on the cold aisle side of the thermal shields 400. Ladder rack 650 is used for data cabling on the hot aisle side of the thermal shields 400.

Figure 3A:
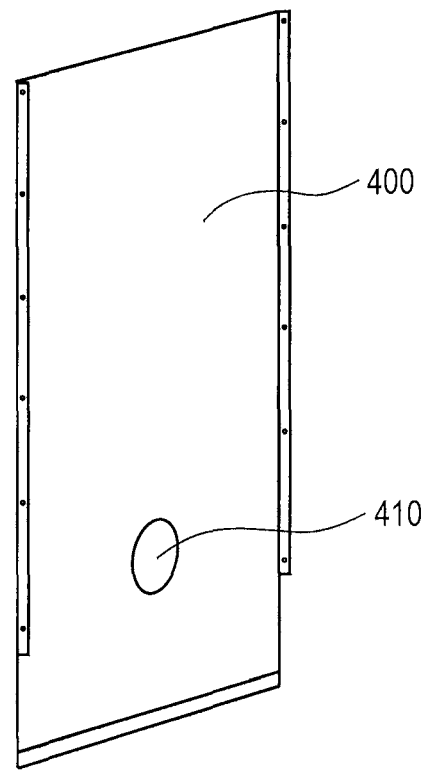
FIGS. 3A and 3B illustrate modular thermal shields used in the thermal compartmentalization and cable and conduit routing system according to the present invention.
Figure 3B:
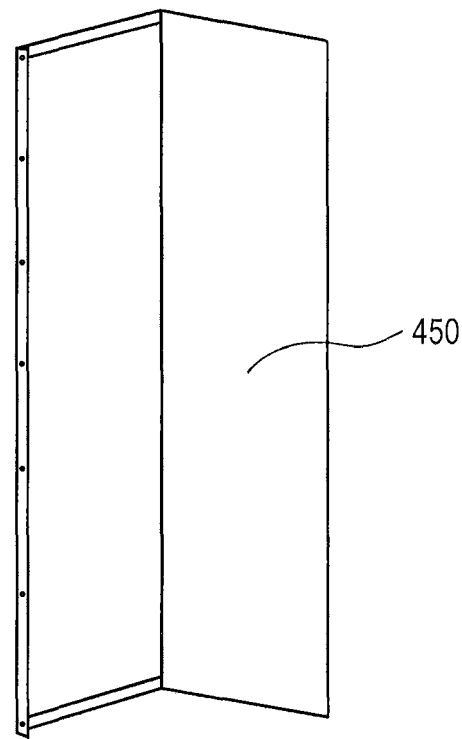

FIGS. 3A and 3B illustrate modular thermal shields 400 and 450, respectively, used in the thermal compartmentalization and cabling and conduit routing system according to the present invention. Both shields 400 and 450 are made of a structurally sound material, including but not limited to steel, a composite, or a plastic, and if a plastic, one that preferably has an air space between a front piece of plastic and a back piece of plastic for an individual shield 400. Shield 400 includes a through-hole 410 that allows for certain cabling, if needed, to run between the hot and cold aisle areas, through the shield 400. A through-hole cover (not shown) is preferably used to substantially close the hole to prevent airflow therethrough. Shield 450 has a 90 degree angle that allows the fabrication of corners.

It should be appreciated that the construction of the cabinets, the shields 400 and 450, and the shield supports 500 are all uniform and modular, which allows for the efficient set- up of the facility, as well as efficient repairs if needed.

Other different embodiments of data center or co-location facilities according to the present invention also exist. For example, while the false ceiling 140 is preferred, many advantageous aspects of the present invention can be achieved without it, though its presence substantially improves airflow. Furthermore, the evaporation units for the air conditioning system can also be located outside the facility, in which case the chamber 240 is not needed, but hot air from the ceiling can be delivered to evaporation units that are disposed above the ceiling, which is more efficient in that it allows the warm air to rise. If the complete air conditioning equipment is located outside, including the evaporators, the refrigerant/water lines 122 that are used to exchange the refrigerant/water if the evaporators are disposed inside the facility is not needed, which provides another degree of safety to the equipment therein.

It is noted that aspects of the present invention described herein can be implemented when renovating an existing facility, and as such not all of the features of the present invention are necessarily used.

Data Management Center and Integrated Wiring System

In one aspect, the embodiments herein are directed to an overall data management center, including the building itself, interior aspects of the building, as well as equipment purposefully located outside yet in close proximity to the building, which equipment is used for purposes of providing both building cooling as well as supplemental power, as described further herein. In one particular aspect, the center core of the building that contains the electronics equipment is purposefully created in a manner that provides only essential equipment and ducts needed to provide power, communications, and air flow, while putting into periphery areas of the building and outside, other equipment that could interfere with the electronics equipment, whether due to that other equipment requiring extremely high power and/or water or other liquids to function, all of which can have a detrimental impact on the electronics equipment.

Figure 5A:
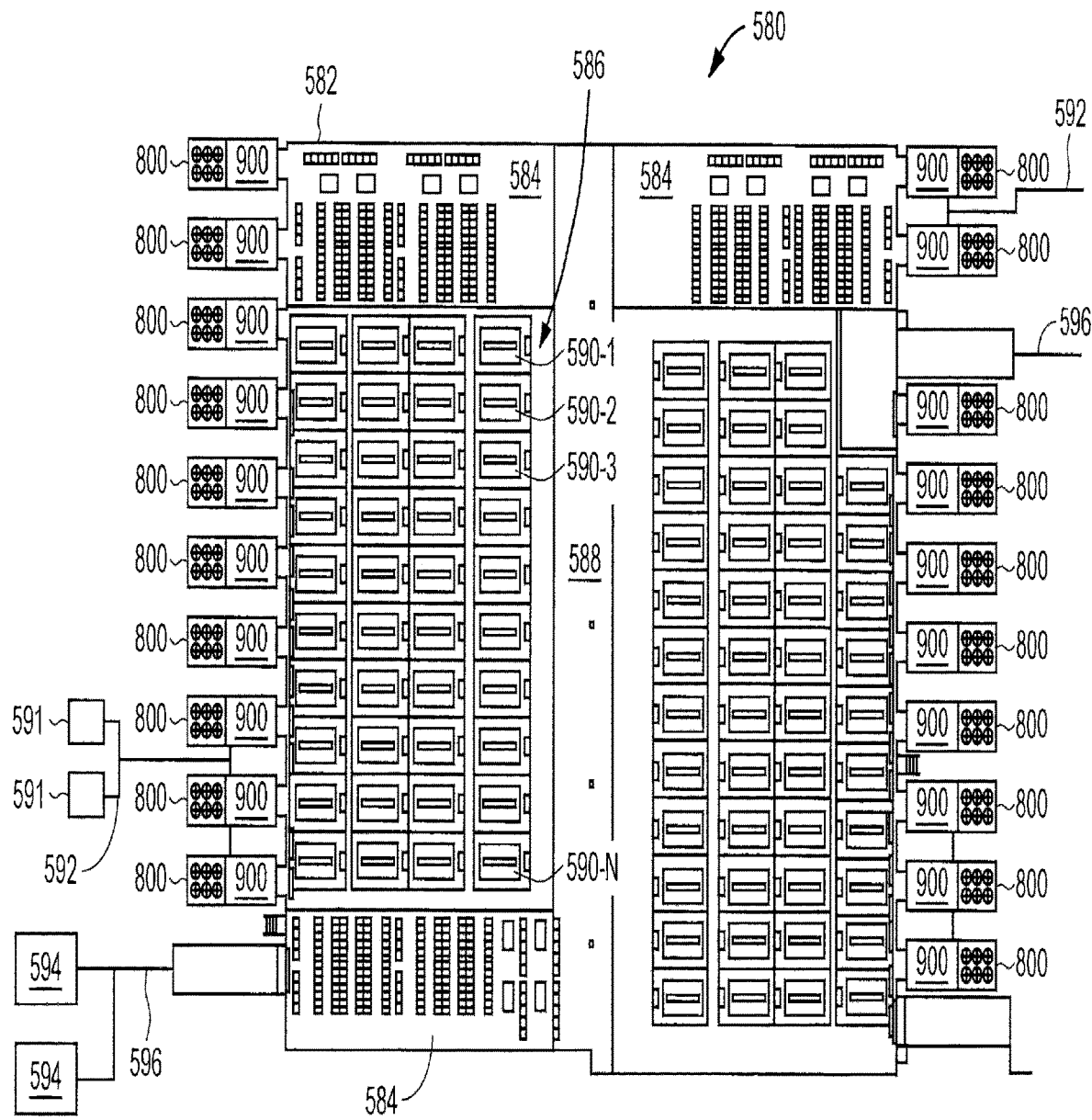
FIG. 5A illustrates a top view of a data center or co-location facility according to another embodiment of the present invention.

FIG. 5A illustrates a top view of a portion of a data center or co-location facility 580 according to another embodiment of the present invention. In this embodiment, unlike the embodiment shown in FIG. IA- I C, the condenser air conditioning units 800 and heat expulsion chamber 900 are all disposed outside of the exterior walls 582 of the facility, as will be described further herein. There is also additional equipment disposed outside of the exterior walls 582, including evaporation units 59I that feed cooled water along lines 592 to the air conditioning units 800 as described further herein, as well as backup diesel generators 594 for supplying backup power along a transmission line S96 in the case of power outage from remotely supplied power on the national power grid.

FIG. 5B1 illustrates a cut-away perspective view of an exterior and interior portion (with a 90° rotation for illustrative purposes of the interior portion) of the data center or co-location facility S80, with the exterior wall S82 being explicitly illustrated. Shown are two of the cabinet clusters S90-1A and S90-2A, and the corresponding hot air area containment chambers 210 and cold air ducts 310, which are respectively connected to the warm exhaust outlets 240-0 and cold duct inlets 310-1. The warm exhaust outlets 240-0 and cold duct inlets 310-I connect to heat expulsion chamber 900 and condenser units 800, respectively.

FIG. 5B2 provides a slightly varied embodiment, in which the cold duct inlets 310-I and warm exhaust outlets 240-0 are each at the same level as the condenser units 800 and heat expulsion chamber 900, respectively, and the warm exhaust outlets 240-0 contain a 90° angled area, which allows for better hot air flow into the heat expulsion chambers 900.

Within the facility there are provided distribution areas 584 and 588, as shown in FIG. 5A, as well as data center equipment areas 586, which equipment areas S86 each contain an array of cabinet clusters 590 (shown in one of the rows as cabinet clusters 590-1, 590-2, 590-3 . . . 590-N), since within each cabinet cluster 590, various cabinets 110 containing different electronic equipment are disposed in rows, thereby allowing each cabinet cluster 590 to be locked, as well as the cabinets 110 within the cabinet cluster 590. It is apparent that three consecutive cabinet clusters, such as 590-1, 590-2 and 590-3 correspond to the three identified clusters that are disposed around the associated hot air area containment chambers 210a, 210b and 210c in FIG. 1B. As is illustrated, the electronics equipment within each cabinet 110 of a cabinet cluster 590 is connected in a manner similar to that as described in FIGS. 2A-2C previously.

It is noted that the cabinet cluster may have an actual physical perimeter, such as a cage built with fencing that can be locked and still permits airflow therethrough, or alternatively need not have an actual physical perimeter, in which case the orientation of the cabinets 110 and corresponding other structures as described previously with reference to FIGS. 1A-1C can also define this same space.

In some embodiments, the cabinet cluster may comprise sensitive electronic equipment that is to be kept out of view from unauthorized persons. In this instance, the physical perimeter may comprise fencing or paneling that permits airflow while also blocking view of the cabinet cluster.

Figure 5C:
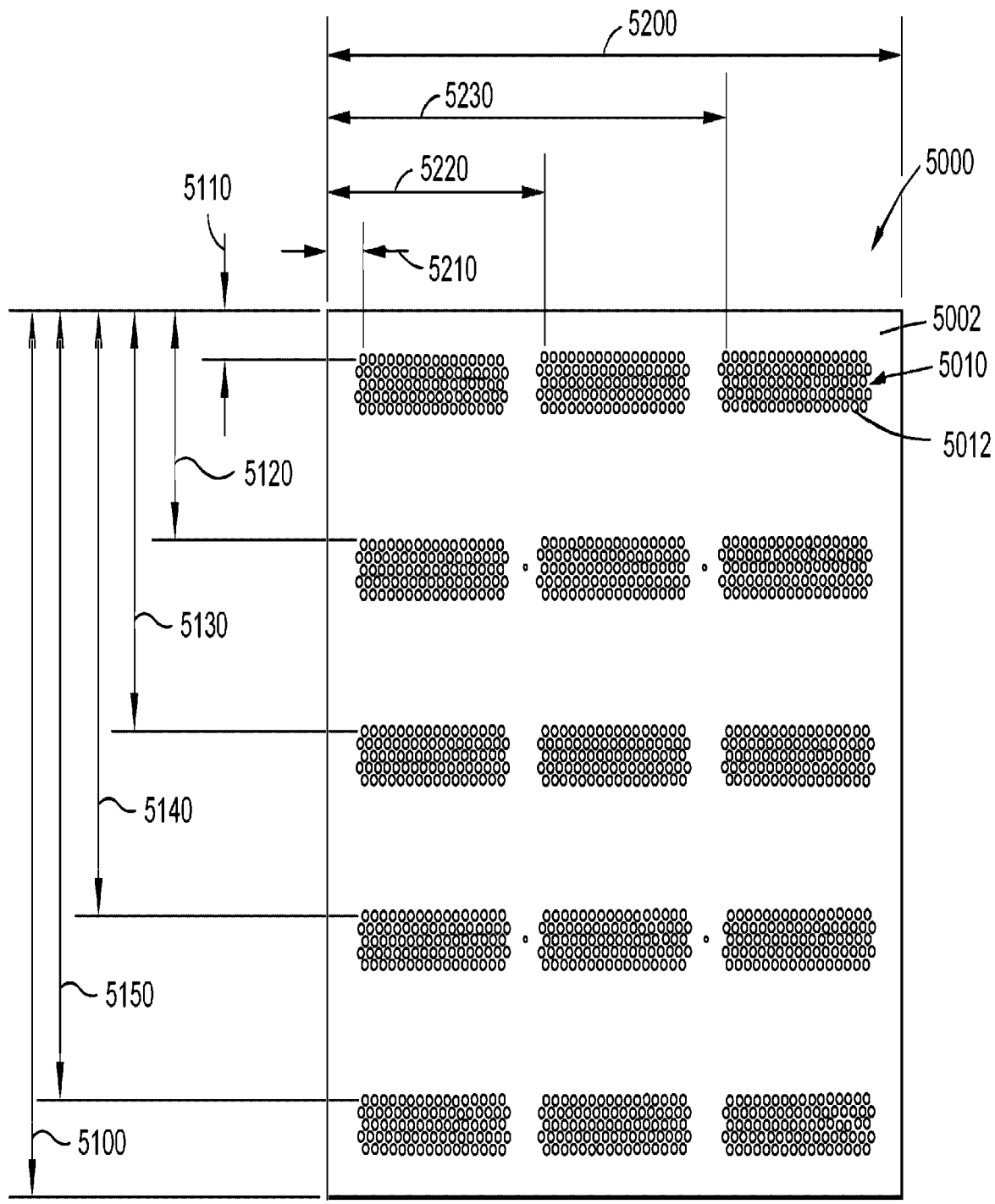
FIG. 5C shows a first security panel allowing air flow therethrough, according to one exemplary embodiment.

FIG. 5C shows a first security panel allowing air flow therethrough, according to one exemplary embodiment. The first security panel 5000 is comprised of a panel 5002 formed from a sheet metal or other suitable material. The panel 5000 includes a plurality of hole arrays 5010. The hole arrays 5010 are made up of holes 5012 that allow air flow from one side of the panel 5000 to the other.

Figure 5D:
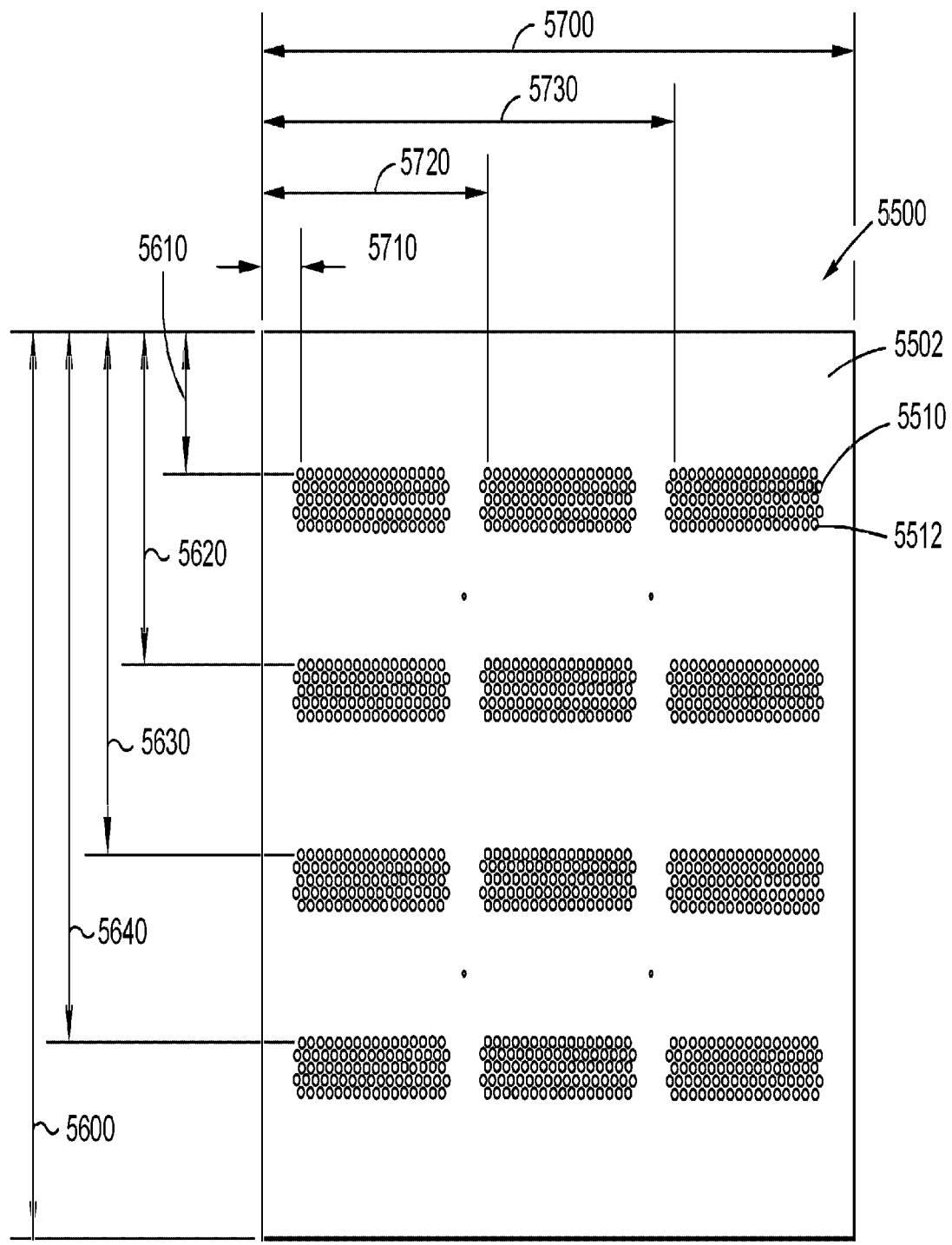
FIG. 5D shows a second security panel allowing air flow therethrough, according to one exemplary embodiment.

FIG. 5D shows a second security panel allowing air flow therethrough, according to one exemplary embodiment. The second security panel 5500 is comprised of a panel 5502 formed from a sheet metal or other suitable material. The panel 5500 includes a plurality of hole arrays 5510. The hole arrays 5510 are made up of holes 5512 that allow air flow from one side of the panel 5500 to the other.

The hole arrays 5010, 5510 are positioned on each of the panels 5000, 5500 so that when the panels are aligned and parallel with one another, the hole arrays 5010, 5510 do not overlap. In this manner, the air flow may still travel through the panels 5000, 5500, but a direct line of sight from the outside to the inside of the physical perimeter is prevented.

Accordingly, returning to FIG. 5C, the first panel 5000 is formed with a first vertical dimension 5100 and a first horizontal dimension 5200. From a top of the panel 5000, a first row of hole arrays 5010 begins at a first-row dimension 5110 from the top of the panel 5000. A second row of hole arrays 5010 begins at a second-row dimension 5120 from the top of the panel 5000. A third row of hole arrays 5010 begins at a third-row dimension 5130 from the top of the panel 5000. A fourth row of hole arrays 5010 begins at a fourth-row dimension 5140 from the top of the panel 5000. A fifth row of hole arrays 5010 begins at a fifth-row dimension 5150 from the top of the panel 5000.

The columns of the hole arrays 5010 may be positioned such that a first column of hole arrays 5010 begins at a first-column dimension 5210 from the left side of the panel 5000, a second column of hole arrays 5010 begins at a second-column dimension 5220 from the left side of the panel 5000, and a third-column of hole arrays 5010 begins at a third-column dimension 5230 from the left side of the panel 5000.

As shown, the dimensions of the positions of the rows of hole arrays 5010 in the first panel 5000 leave spaces adequate to line up with hole arrays 5510 of the second panel. In one exemplary embodiment, the first vertical dimension 5100 of the panel 5000 is 43 inches. The first-row dimension 5110 may be 2.296 inches, the second-row dimension 5120 may be 11.296 inches, the third-row dimension 5130 may be 20.296 inches, the fourth-row dimension 5140 may be 29.296 inches, and the fifth-row dimension 5150 may be 38.296 inches. The first horizontal dimension 5200 may be 47.687 inches, the first-column dimension 5210 may be 3.219 inches, the second-column dimension 5220 may be 18.219 inches, and the third column dimension 5230 may be 33.219 inches. Of course, these dimensions are exemplary, and may be changed based on the size, number, and shape of the holes 5012 in the hole array 5010, the shape of the hole array 5010, the amount of air flow required, etc.

In FIG. SD, the second panel 5500 is formed with a second vertical dimension 5600 and a second horizontal dimension 5700. From a top of the panel 5500, a first row of hole arrays 5510 begins at a first-row dimension 5610 from the top of the panel 5500. A second row of hole arrays 5510 begins at a second-row dimension 5620 from the top of the panel 5500. A third row of hole arrays 5510 begins at a third-row dimension 5630 from the top of the panel 5500. A fourth row of hole arrays 5510 begins at a fourth-row dimension 5640 from the top of the panel 5500.

The columns of the hole arrays 5510 may be positioned such that a first column of hole arrays 5510 begins at a first-column dimension 5710 from the left side of the panel 5500, a second column of hole arrays 5510 begins at a second-column dimension 5720 from the left side of the panel 5500, and a third-column of hole arrays 5510 begins at a third-column dimension 5730 from the left side of the panel 5500.

As shown, the dimensions of the positions of the rows of hole arrays 5510 in the second panel 5500 leave spaces adequate to line up with hole arrays 5010 of the first panel. In one exemplary embodiment, the second vertical dimension 5600 of the panel 5500 is 43 inches. The first-row dimension 5610 may be 5.796 inches, the second-row dimension 5620 may be 15.796 inches, the third-row dimension 5630 may be 24.796 inches, and the fourth-row dimension 5640 may be 33.796 inches. The first horizontal dimension 5700 may be 47.687 inches, the first-column dimension 5710 may be 3.219 inches, the second-column dimension 5720 may be 18.219 inches, and the third column dimension 5730 may be 33.219 inches. Of course, these dimensions are exemplary, and may be changed based on the size, number, and shape of the holes 5012 in the hole array 5010, the shape of the hole array 5010, the amount of air flow required, etc.

Figure 5E:
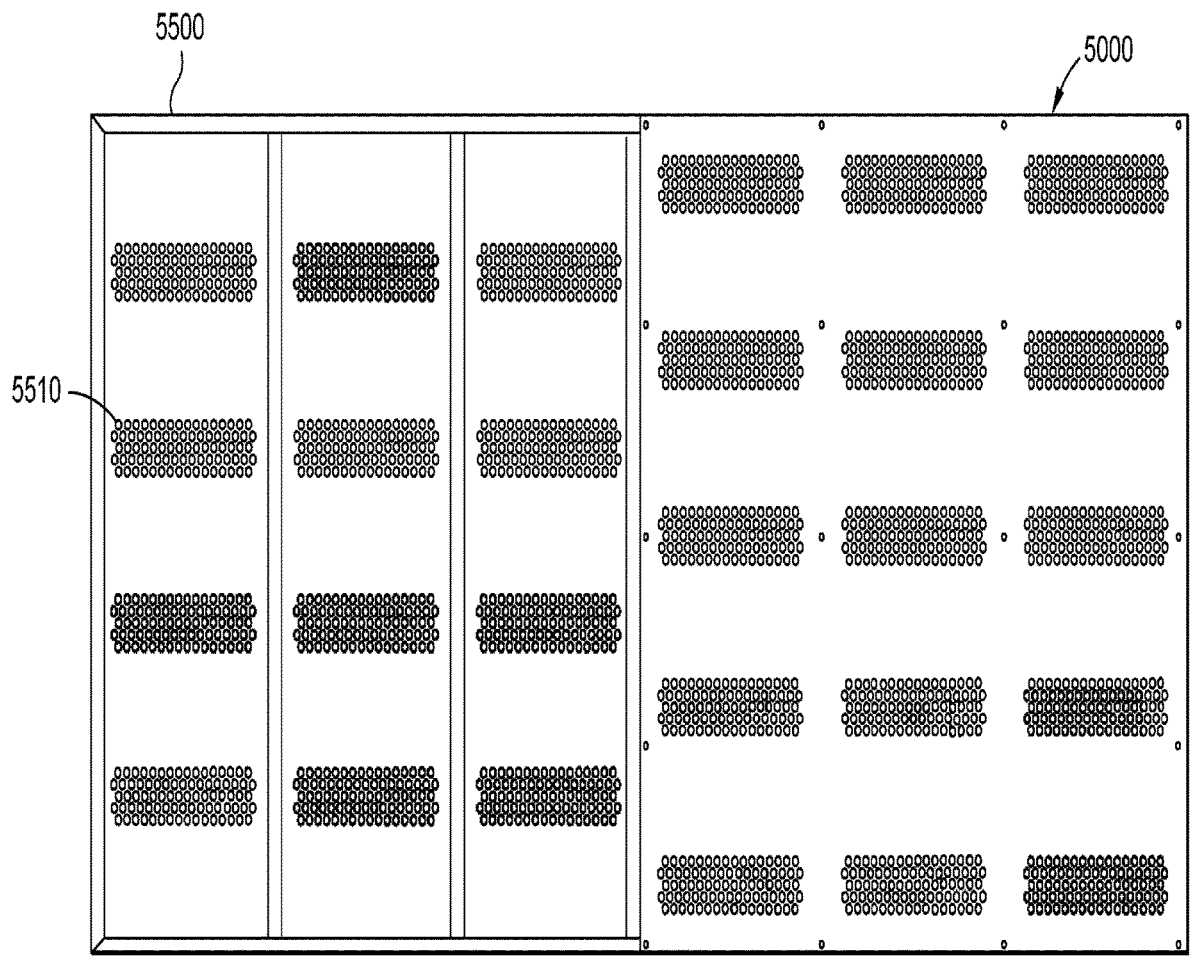
FIG. 5E shows a comparison of the first and second panels.

FIG. 5E shows a comparison of the first and second panels. Here, the rows of the hole arrays 5010 of the first panel 5000 can be seen to be offset from the rows of hole arrays 5510 of the second panel based on the exemplary dimensions provided above. Of course, other configurations are possible. For example, instead of each array extending horizontally and the rows being offset vertically, the arrays may extend vertically with columns being offset horizontally. The arrays may form other shapes instead of the rectangular pattern shown herein, such as square, circular, triangle, or any other number of shapes. The holes in the arrays are shown to be slightly offset so as to be more densely disposed in the arrays, but other hole patterns within the array as well as hole shapes may be included. For example, circular, square, or triangular holes may be aligned vertically and horizontally in the arrays. In other embodiments, the holes may be hexagonal and form a honeycomb shape in the array.

Figure 5F:
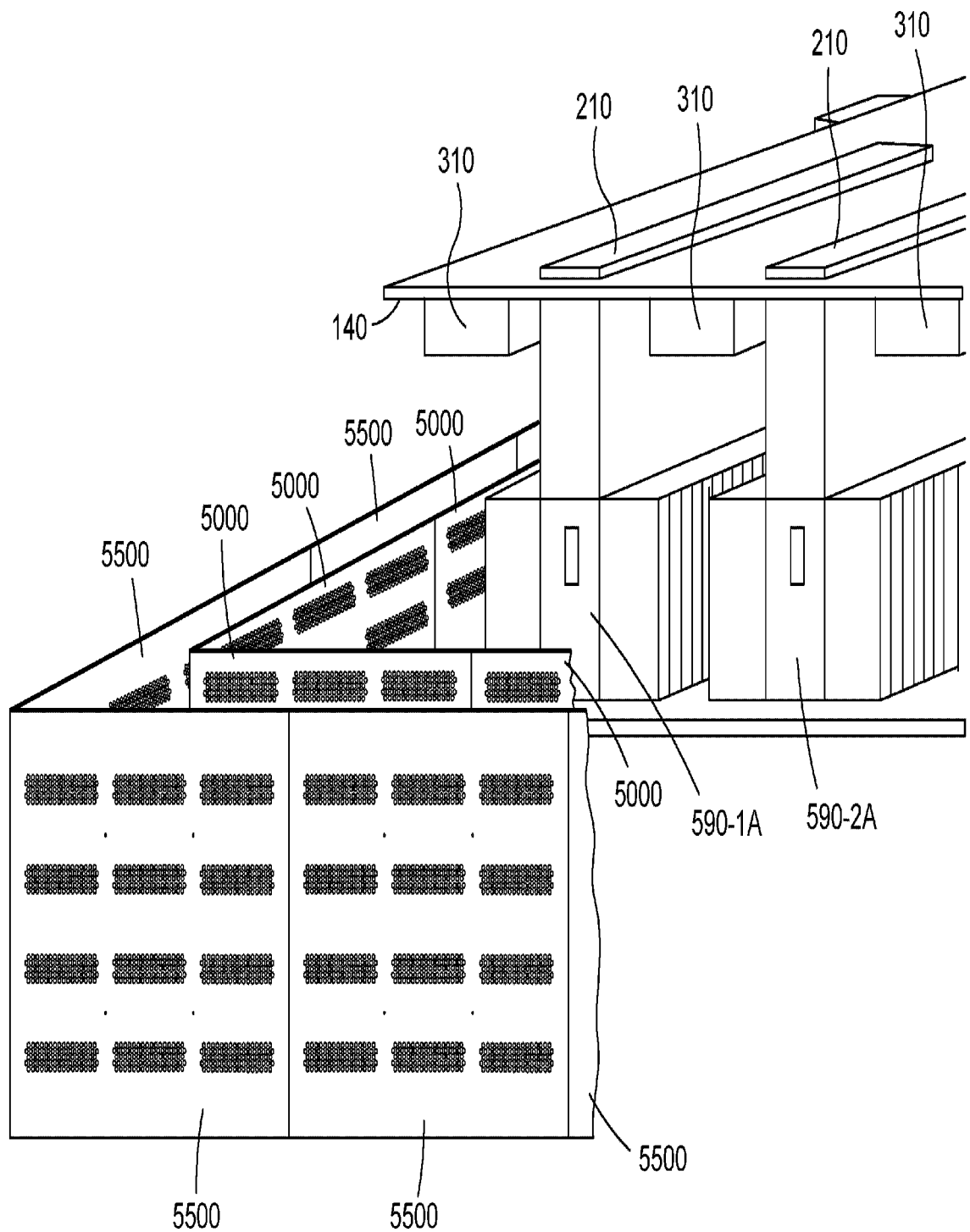
FIG. 5F shows a fenced perimeter around cabinet clusters, according to one exemplary embodiment.

FIG. 5F shows a fenced perimeter around cabinet clusters, according to one exemplary embodiment. As shown in FIG. 5F, cabinet clusters 590 are surrounded walls formed by the first panel 5000 and the second panel 5500 to form a secure perimeter. The prevents the cabinet clusters 590 from being seen from the outside. In this embodiment, the wall formed from the first panels 5000 form an inner perimeter, and the wall formed from the second panels 5500 for an outer perimeter. However, the panels 5000, 5500 may be switched. Further, additional panels may be added on top of the panels shown in FIG. 5F to extend from floor to ceiling. Because the hole arrays of the panels are offset from one another, it is difficult to see through to the cabinet clusters, even though air flow is permitted through the panels.

The manner in which the distribution power wires and conduits, electronic equipment control wires and conduit, data cabling, and miscellaneous cabling is distributed to the cabinet clusters 590 from one of the distribution areas 584 or 588 will be described further hereinafter. As shown in FIG. 5A, telecommunications, and power distribution equipment, further described herein, is used to then feed the appropriate signals and power to the telecommunications equipment and power equipment that is stored within each cabinet cluster 590 (i.e., telecommunications equipment 170 and power equipment 180 described in FIG. 1B). The manner in which the distribution power wires and conduits, electronic equipment control wires and conduit, data cabling, and miscellaneous cabling is distributed to the cabinet clusters 590 from one of the distribution areas 584 and 588 will be described further hereinafter.

Figure 8:
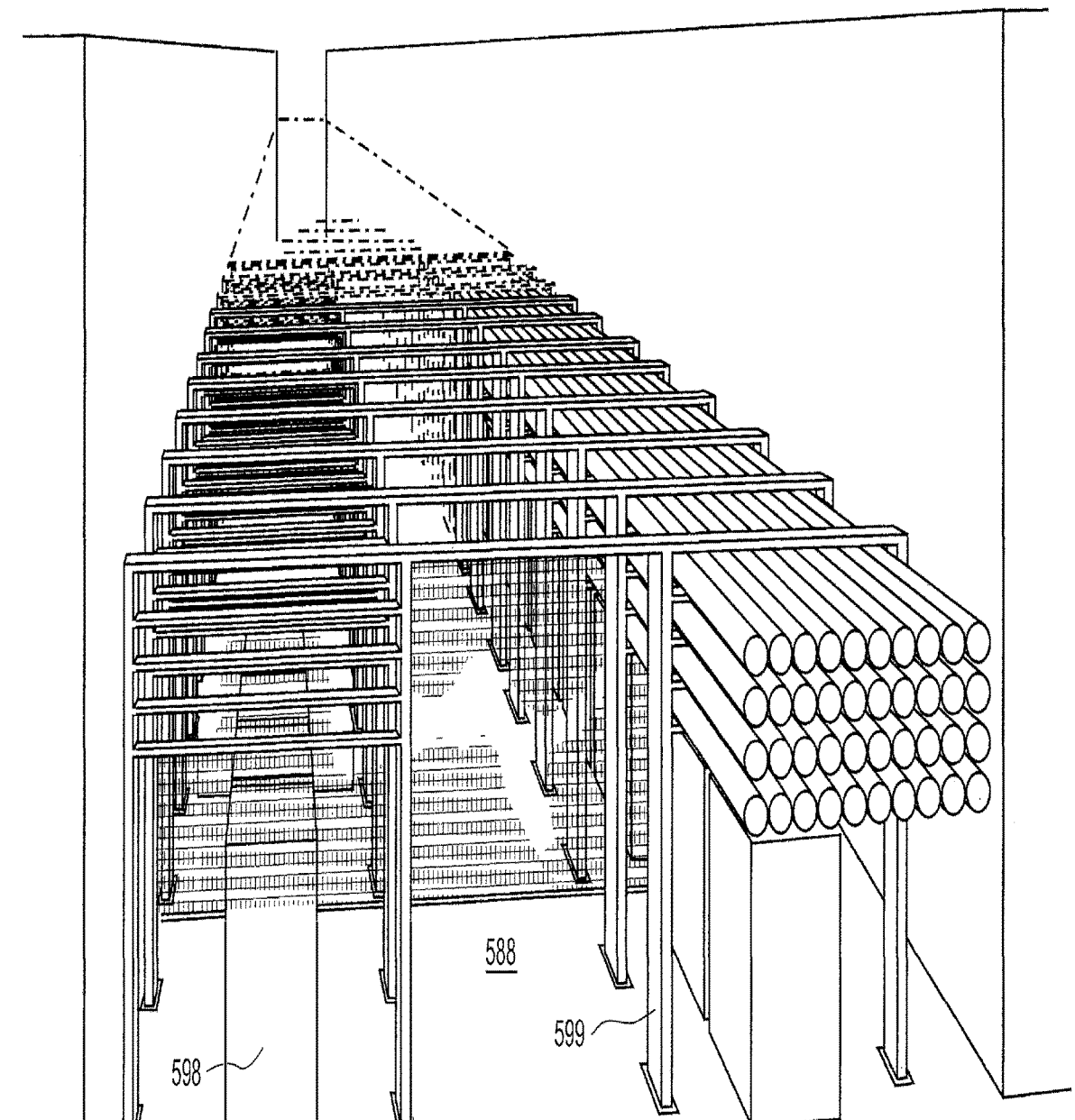
FIG. 8 is a power spine that can also be used with the preferred embodiment.
Figure 9A:
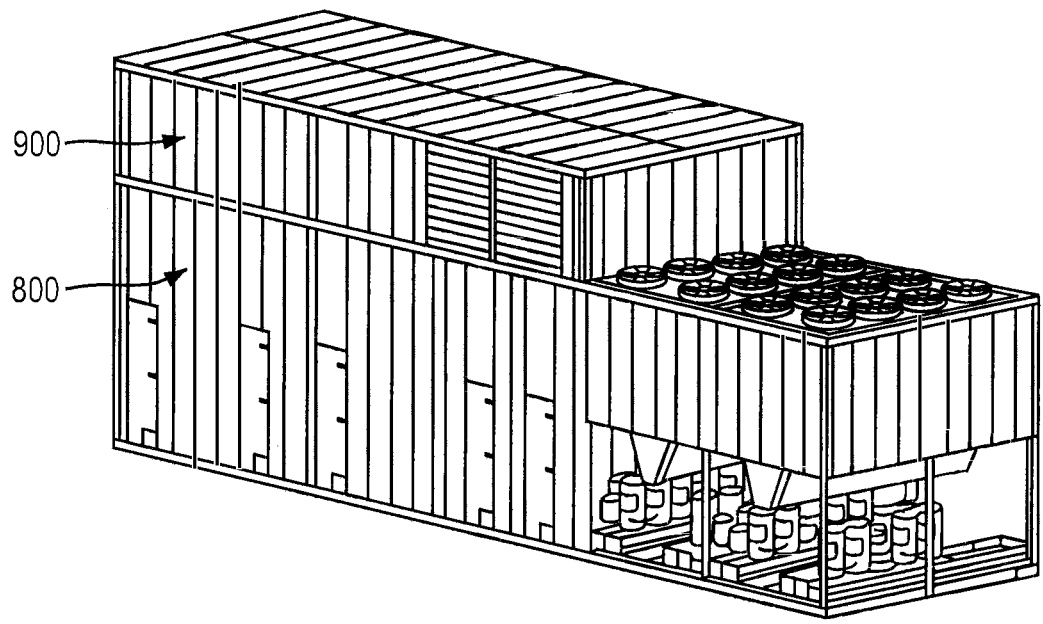
FIGS. 9A-9E illustrate an air handling unit according to a preferred embodiment.
Figure 9B:
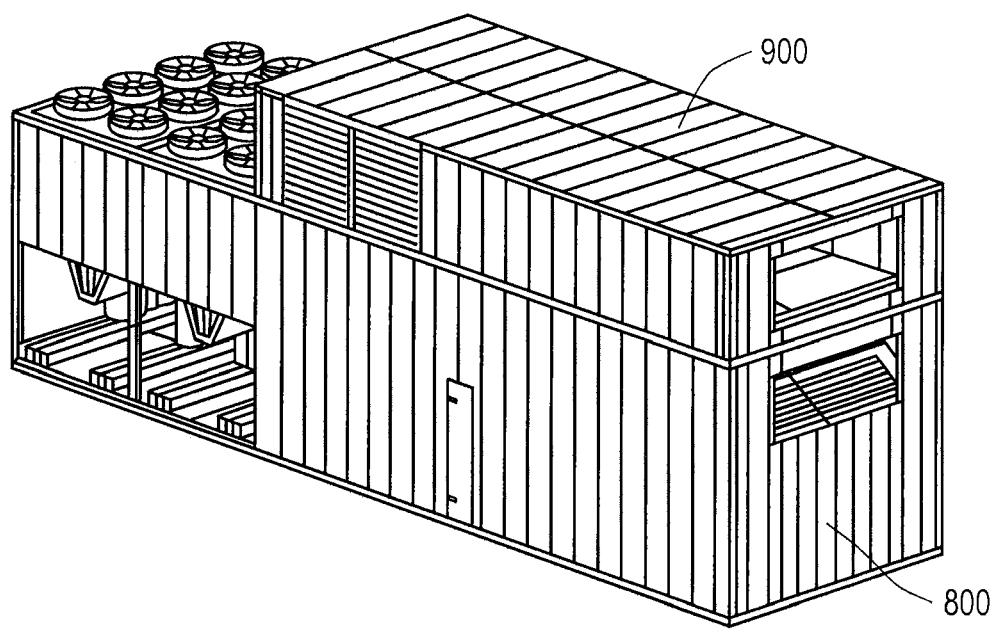
Figure 9C:
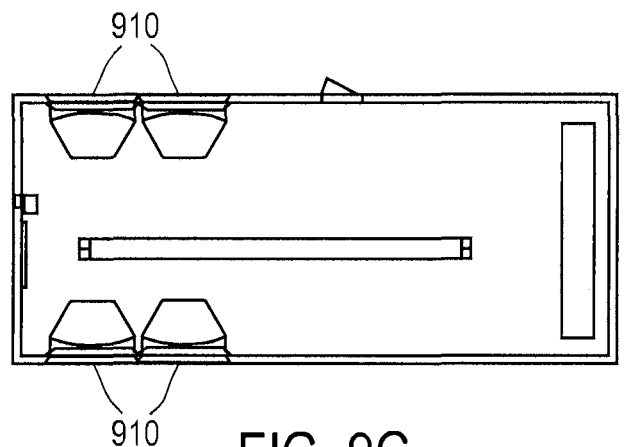
Figure 9D:
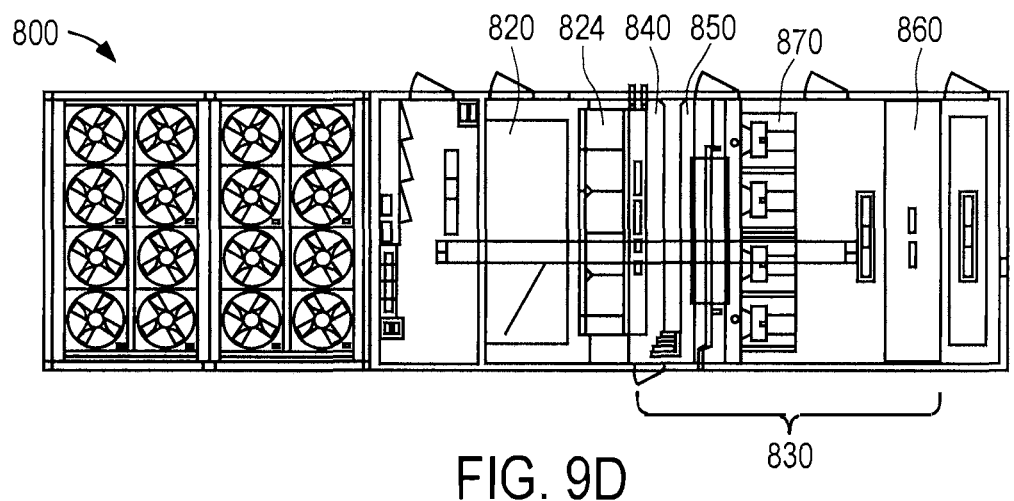
Figure 9E:
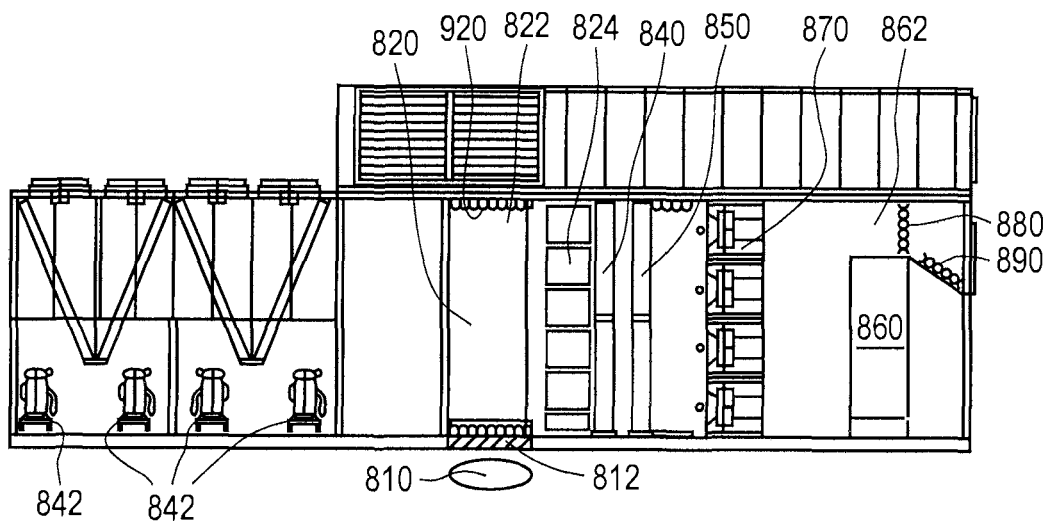

The array of cabinet clusters 590, and the density of the cabinets 110 and the electronics equipment therein, require substantial amounts of power and transmission capacity, which in turns requires substantial amounts of wiring, particularly for power. As described herein, as a result there is described an improved telecommunication bracket 600, which substantially rests over each of the cabinets in the cabinet clusters 590, in order to more easily accommodate the distribution power wires and conduits, as well as telecommunication wires and conduits, as well as control wires and conduits, that are then distributed from the distribution areas 584 and 588 to the telecommunications equipment 170 and power equipment 180 that is within each of the different cabinet clusters 590. As shown in FIG. 5A and FIG. 8, the distribution area 588 contains PDU's 598, described in further detail elsewhere herein, and the distribution area 584 contains transformers to step down the power grid power that is normally at 12477 volts to a 480 volt level, for transmission of 480 volt power to the PDU's 598. Also within distribution area 584 are uninterruptable power supplies in case an outage of power from the power grid occurs, as well as equipment for testing of the various power equipment that is conventionally known.

Figure 7A:
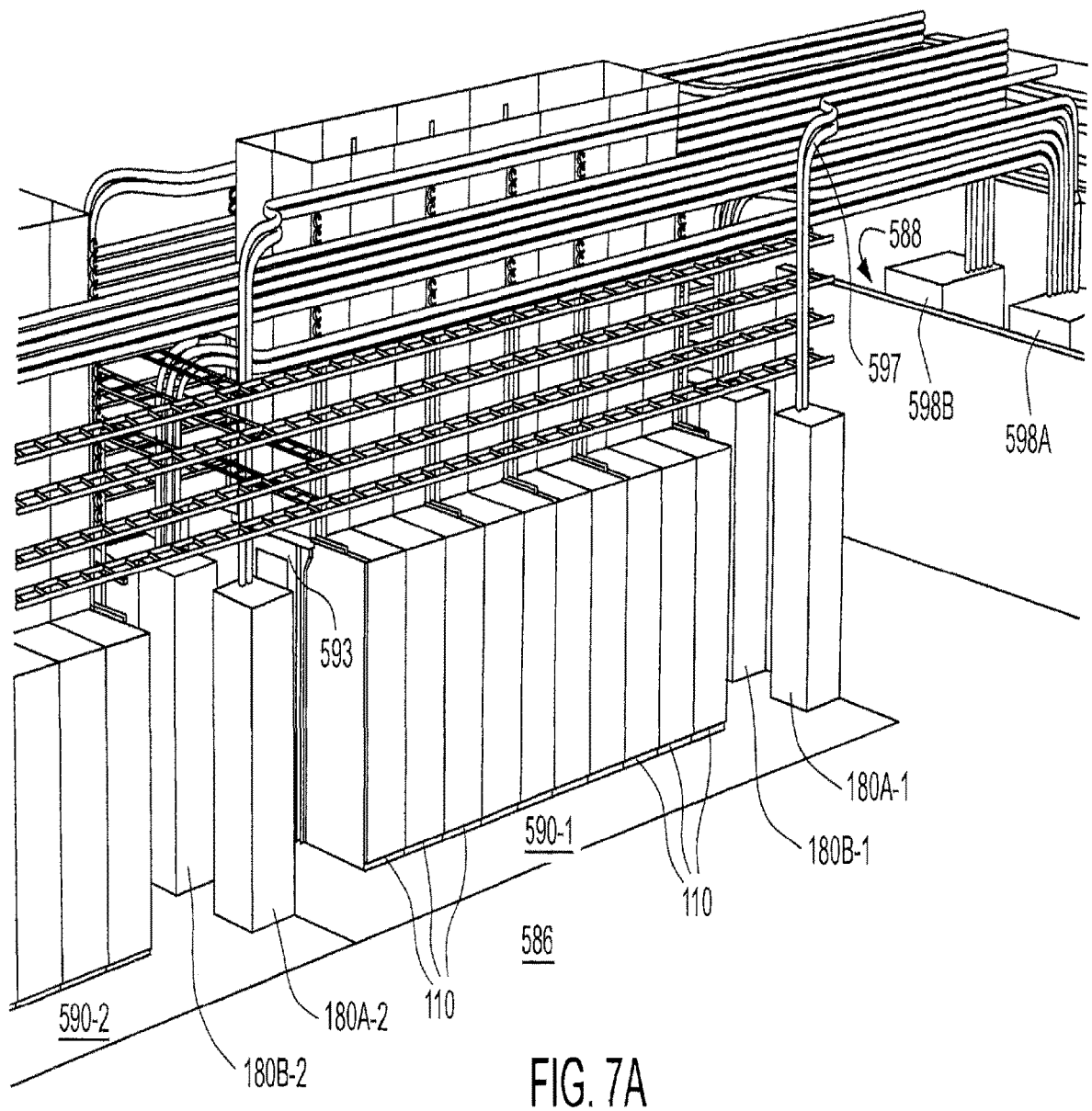
FIGS. 7A and 7B illustrate a section of a distribution area and the data area within a facility according to an embodiment of the present invention.

While FIG. 1B illustrates one configuration of equipment with the cabinet cluster (with the telecommunications equipment 170 and the power equipment 180 within the center of a row), FIG. 7A also shows an alternative configuration of equipment for a cabinet cluster 590, which still contains the same cabinets 110, telecommunication equipment 170 and power equipment 180. In particular, rather than having the power equipment 180 centrally located within a row, in this alternate configuration the power equipment 180 is disposed at an end of each of the rows that are within a cabinet cluster 590. The telecommunication equipment, within this embodiment, can be located anywhere within the row of cabinets 110, within whichever one of the cabinets 110 makes most sense given the usage considerations for that cabinet cluster 590.

In another variation of the FIG. 7A embodiment, the power equipment 180, instead of being somewhat separated from the cabinets 110 within a cluster 590, instead abut right next to one of the cabinets 110. This, along with the doors 593 shown in FIG. 7A then being attached between adjacent power equipment at the end of the cabinet row instead of at the end cabinet, keep all the equipment in a tightly configured space. In any of the embodiments shown, whether FIG. 1C, 7A or as described above, the thermal shield 400 that creates the hot air area containment chamber 210 above the cabinets, coupled with the doors that seal off the area between the rows of cabinets 110 within a cluster 590, provide an environment that prevents the hot air within the hot air area 52 from escaping out into the main data center floor, and ensures that the hot air instead travels up through the hot air area containment chamber 210 and into the gap disposed between the false ceiling 140 and the actual ceiling 150.

Within equipment area 586 is thus established an array of cabinet clusters 590, which cabinet clusters align with each other to allow for the overhead stringing of telecommunications and power wiring as described herein. Within each cabinet cluster 590, as also shown in FIG. 1B, is telecommunications equipment 170 to which the electronics equipment in each of the cabinets 110 connect, as well as power equipment 180 used to connect the electronics equipment to power. The array of cabinet clusters 590, each also containing brackets, such as brackets 500 or 600, as described herein. For a larger size data center as illustrated in FIG. 5A that contains a very large array of cabinet clusters 590, brackets 600 are preferable, as they allow for additional conduit support areas. These brackets 600, discussed further herein with respect to FIGS. 6A and 6B, contain ladder racks 510, 520, 530 and 540 that are used for stringing power and telecommunication wiring within each cabinet cluster 590, as well as contain additional vertical support with conduit clamps that are used to hold power and telecommunication lines that pass from each cabinet cluster 590 to other central telecommunication and power distribution areas, as discussed further herein, as well as to hold power and telecommunication lines that pass over certain of the cabinet clusters 590 in order to be strung to other of the cages areas 590. Still further, these same brackets 600, being preferably mounted over the cabinets 110, and at least having a significant portion of the bracket disposed over the cabinets 110, are used to mount the thermal shield within the cabinet cluster 590, the thermal shield providing a contiguous wall around the central hot air area of the cabinet cluster 590, and defining a warm exhaust channel that traps the heated air within the central hot air area and causes substantially all the heated air within the central hot air area to rise up within the warm exhaust channel. These brackets 600 also preferably span from the top of the cabinets 110 to the bottom of the false ceiling 140 to provide further stability.

It is apparent that the power and telecommunication lines that pass from each cabinet cluster 590 to other more central telecommunication and power distribution areas will necessarily pass, in some instances, over other cabinet clusters 590. Since the vertical support 610 with conduit clamps 620 are above the ladder racks 510, 520, 530 and 540 for each of the brackets 600, as well as above each of the cabinets 110, this allows for long runs of power and telecommunication lines that pass from each cabinet cluster 590 to other more central telecommunication and power distribution areas to exist without interfering with the wiring that exists within each cabinet cluster 590. Furthermore, by creating a sufficient area of vertical support and conduit clamps, it is then possible to run additional power and telecommunication lines from certain cabinet clusters 590 to other more central telecommunication and power distribution areas without having to re-work existing wiring. This makes expansion much simpler than in conventional designs.

Figure 6A:
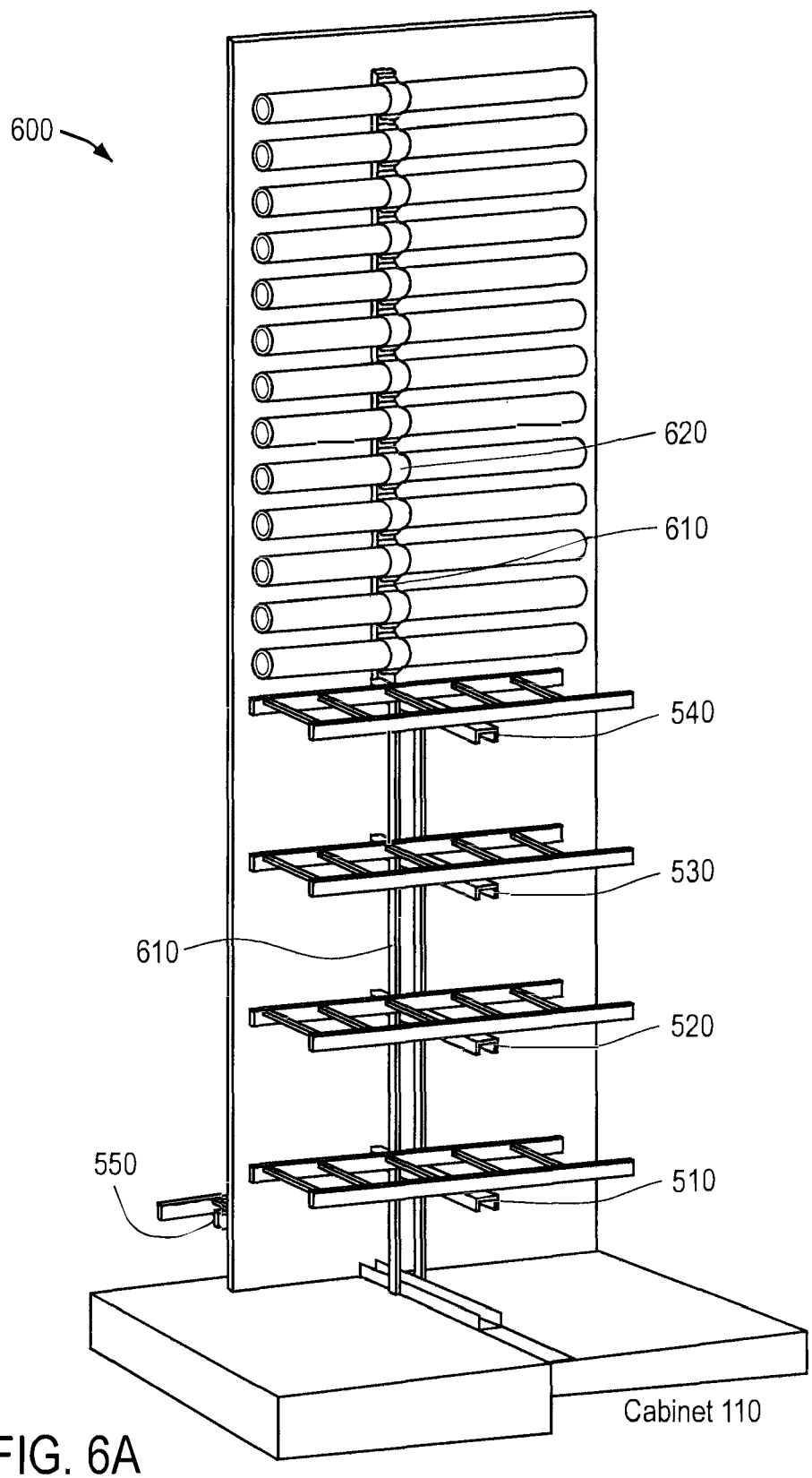
FIGS. 6A and 6B illustrates other telecommunication brackets used in the thermal compartmentalization and cable and conduit routing system according to the present invention.
Figure 6B:
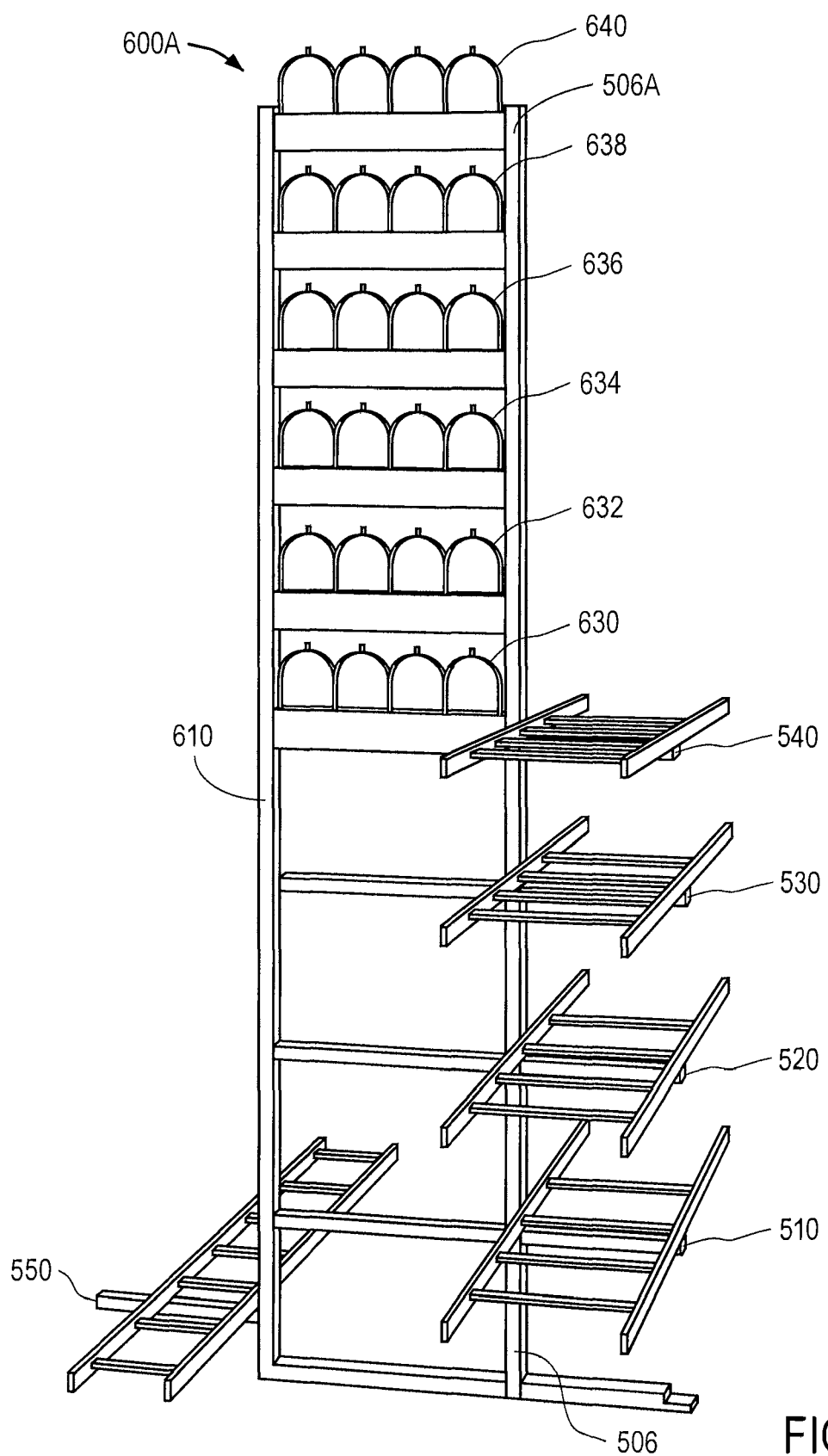

FIGS. 6A and 6B illustrate in detail two different embodiments of the telecommunication bracket 600 referred to above that is used in the thermal compartmentalization and cable and conduit routing system according to the present invention. This bracket 600 serves the same purpose as the bracket 500 illustrated and described previously with respect to FIG. 4, and as such similar parts of the bracket 600 are labeled the same and need not be further described herein. This bracket 600, however, additionally provides additional vertical support 610 that allows for the running of additional wiring and conduits.

In FIG. 6A, this additional vertical support 610 includes conduit clamps 620 that allow the clamping of the additional conduits to the additional vertical support 610.

In FIG. 6B, the bracket 600A has in addition to the vertical support 610 a support beam 506A (which extends upwards from the support beam 506 shown in FIG. 4), and racks 630, 632, 634, 636, 638, and 640 therebetween. Each of the racks 630, 632, 634, 636, 638, and 640 have room for at least 4 different 4" conduits to run wiring or cabling therethrough. Whether the conduit clamps or additional conduit racks are used, both provide for conduit holding, and holding of the wires or cables within the conduits.

In both the brackets 600 of FIGS. 6A and 6B, the additional wiring/conduit is distribution power wires and conduits and other wire/conduit for control uses, for example. As explained hereafter, the distribution power wires and conduits can run from various power equipment units 180 disposed in each of the cabinet clusters 590 to various other high power distribution units (PDUs) 598 disposed within the distribution area 588, as shown in FIG. 7A.

FIG. 7A also illustrates the distribution of power PDUs 598 within a section of the distribution area 588 to power equipment 180 in an end cabinet cluster 590-1 within a section of the data equipment center area 586 via distribution power wires and conduit (one shown as 597). In particular, as is shown, distribution power wires and conduit goes from each of the PDUs 598A and 598B to the power equipment unit 180A within the end cabinet cluster 590-1, and distribution power wires and conduit also goes from both the PDUs 598A and 598B to the power equipment unit 180B within the end cabinet cluster 590-1, so that redundant power can be provided to the electronic equipment within each row. Since power is provided to each piece of power equipment 180 from two different sources, these power equipment units can also be called redundant power panels, or RPP's. In addition, distribution power wires and conduit go from each of PDUs 598A and 598B over the end cabinet cluster 590-1 to further cabinet clusters 590-2, 590-3 to 590-N. The array of cabinet clusters 590 are aligned as shown in FIG. 5A so that the brackets 600 in different cabinet clusters 590 nonetheless can together be used to string distribution power wires and conduit and other wires/fibers with conduits as needed.

In a preferred configuration of the power equipment 180 shown in FIG. 7A provides redundant 120 volt AC power from each RPP 180 to the electrical equipment in each of the cabinets 110 within the row of the cabinet cluster 590. Within the RPP 180 are circuit breakers as is known to protect against energy spikes and the like, as well as energy sensors associated with each circuit so that a central control system, described hereinafter, can monitor the energy usage at a per circuit level. In a typical implementation, there are 42 slot breaker panels that are associated each with 120c/208v power that is then supplied to each of the electronic components as needed, in wiring that uses one of the ladder racks 630 or 640 as discussed previously to the necessary cabinet 110. Of course, other power configuration schemes are possible as well.

Figure 7B:
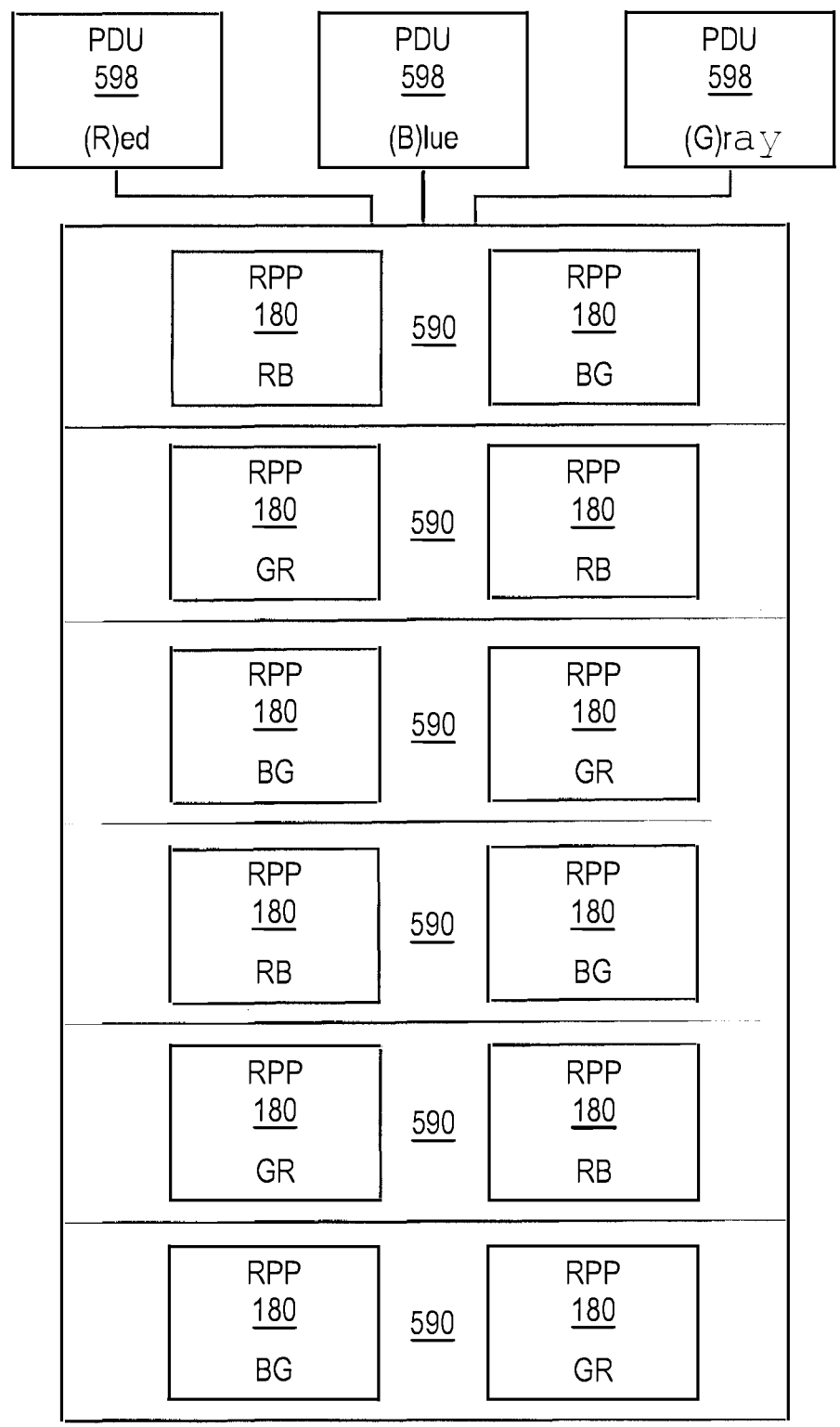

In a preferred configuration for a module of cabinet clusters 590, as schematically shown in FIG. 7B, there are three different PDUs 598 that each receive 480vAC 3-phase power and provide 120vAC 3-phase power service to each of 8 different RPPs 180 via the distribution power wires and conduits. This allows, for a completely used module, 6 different cabinet clusters 590 to be serviced from 12 RPP's 180, two in each cage, and 3 different PDU's 598. By providing redundancy of both RPP's 180 (×2) and PDUs 598 (×3), this allows for maximum power usage of the various components with sufficient redundancy in case any one of the PDU's 598 or any circuit on an RPP 180 fails.

A lock-related aspect of the present invention with respect to the RPPs 180 as well as the PDU's 598 is that since there are three circuits from the PDU's t the RPP's, within a dual RPP each side of the cabinet will have separate lock, such that all locks of a particular circuit can be opened by the same key, but that key cannot open locks of any of the other two circuits. This is an advantageous protection mechanism, as it prohibits a technician from mistakenly opening and operating upon a different circuit than a circuit he is supposed to service at that time.

FIG. 8 shows a power spine 599 that can also be used with the preferred embodiment to provide power from the power grid to each of the PDU's 598. As illustrated, rather than running the power spine through the roof as is conventionally done, in this embodiment the power spine 599 is run along a corridor within the distribution area 588 that channels all of the main building wiring and electrical components. This advantageously reduces stress on the roof and building structure, as the weight of the power spine and related components are supported internally within the corridor structure as shown.

Data Center Air Handling Unit

Another aspect of the data center is the air handling unit that provides for efficient cooling.

As is illustrated in FIGS. 5A and 5B1-2, one condenser unit 800 is paired with one heat expulsion chamber 900, and each are preferably independently movable. As is further illustrated, the condenser units 800 are built to a size standard that allows for transport along US state and interstate highways. Further, the heat expulsion chamber 900 is preferably sized smaller than the condenser unit 800, but still having dimensions that allow for transport using a semi-trailer. When transported to the facility 500, the condenser unit 800 is first placed into position, as shown here on posts 588, but other platforms can also be used. As shown in this embodiment, the heat expulsion chamber unit 900 is placed over the condenser unit 800, though other placements, such as adjacent or below, are also possible. Connections of power conduit, miscellaneous cabling, and water needed for proper operation of the condenser units 800 and expulsion chamber 900 is preferably made using easily attachable and detachable components.

With this configuration, the units 800 and 900 are located in standardized, accessible and relatively convenient positions relative to the facility 580 should any of the units 800/900 need to be accessed and/or removed for repair or replacement. Further, these units 800/900 are themselves created using an intentionally transportable design.

FIGS. 9A-9E provide further details regarding the condenser unit 800 and its paired heat expulsion chamber 900. In particular, as shown, the air conditioning apparatus includes the condenser unit 800 and its paired heat expulsion chamber 900. The heat expulsion chamber 900 receives heated air, and emits vented air, and the vented air is released into the external environment, while the condenser unit 800 emits cooled air.

Figure 10:
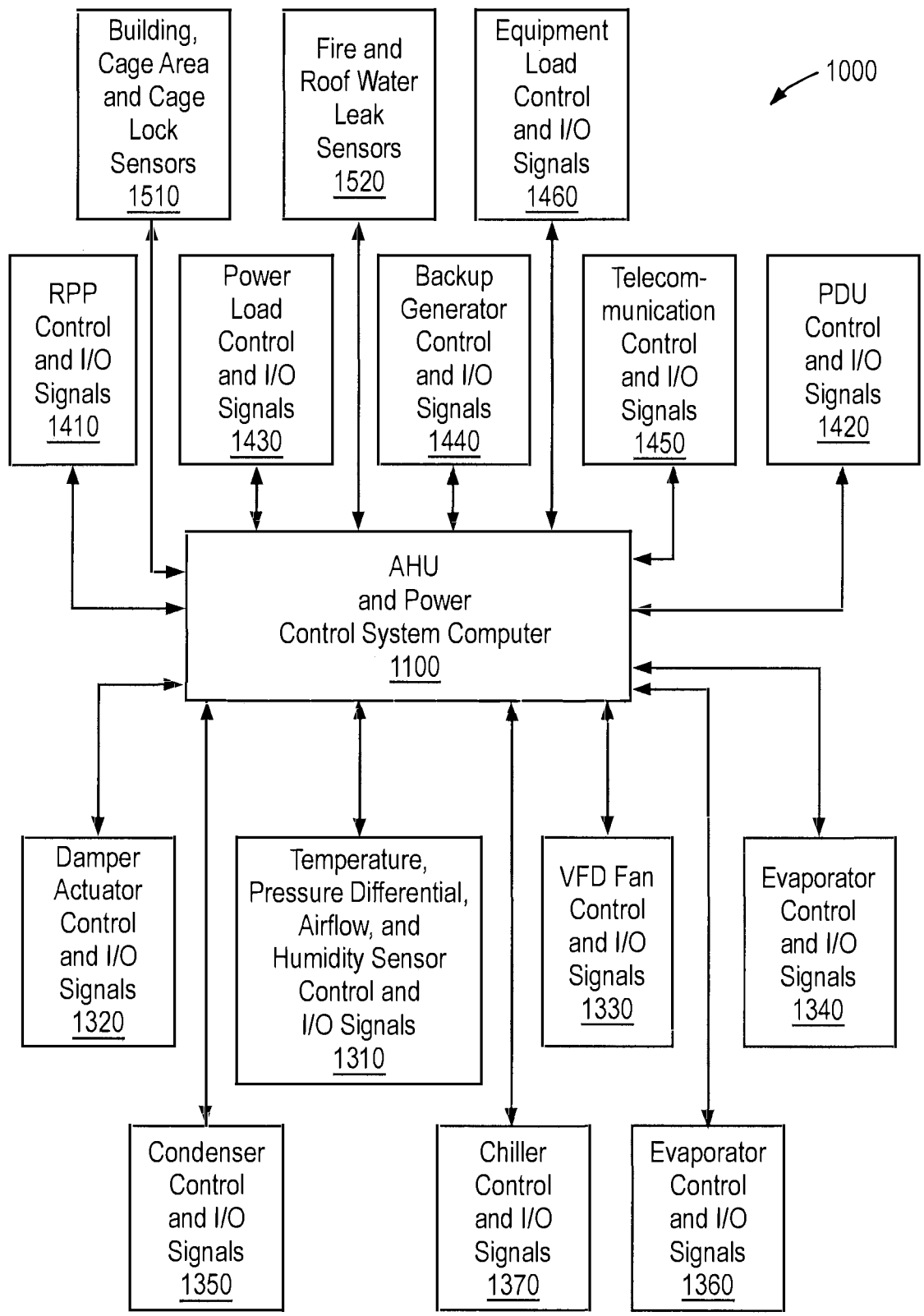
FIG. 10 illustrates a control system used by the data center.

The heat exchange unit 900 contains an exhaust fan 910, controlled by a VFD fan control and I/O signals block 1330 shown in FIG. 10, that emits heat from the heated air as the vented air, thereby allowing return air to pass through a return damper 920, which return damper 920 has a return damper actuator associated therewith.

The condenser unit 800 includes an outside air inlet 810, and has associated an outside air damper 812, thereby allowing outside air to pass therein. This outside air damper 812 is preferably coated with a neoprene seal to prevent pollution particles from passing through the damper 812 when in a closed position, as well as contains a spring-loaded mechanism closing lever that will automatically close the outside air damper 812 upon a removal of power, so that outside air is prevented from intake before backup generators 594 have to start, since after a power-grid power failure condition, before the back-up generators start, uninterruptable power supplies will supply building power, giving a period for the outside air damper 812 to close.

A filter chamber 820, which includes an air intake area 822 coupled to the heat expulsion unit 900 and the outside air inlet 810, is configurable, via the AHU control system 1000, described hereinafter, to receive the return air, the outside air, as well as a mixture of the return air and the outside air, the filter chamber resulting in filtered air. In a preferred implementation of the filters 824 within the filter chamber 820 are included a MERV 7 screen filter 824A with a MERV 16 bag filter 824B therebehind, which allows replacement of the screen filter 824A without replacement of the bag filter 824B, and vice-versa.

The condenser unit 800 includes an air cooling area 830 over which the filtered air passes to create the cooled air. For ease of nomenclature, all of the air within the air cooling area 830 is referred to as filtered air, and only upon emission from the condenser unit is it referred to as cooled air. That notwithstanding, it is understood that along various stages of the air cooling area 830, the filtered air will get progressively cooler in temperature.

The air cooling area 830 of the condenser unit 800 includes a direct cooling coil 840 filled with a gas for direct expansion, such as R134 gas, over which the filtered air passes, the gas being circulated through a condenser 842 disposed in another area of the condenser unit housing, but still in the external area, outside of the building.

The air cooling area 830 also includes an indirect cooling coil 850 filled with cooled water over which the filtered air passes, the cooled water being circulated through an evaporation unit 590 also disposed in the external area, via a water line 592 as shown in FIG. 5A Optionally, though not shown, another coil that is cooled by a chiller could be included.

Also shown in FIGS. 9A-9E is that the air cooling area also has an evaporator 860 that provides a water wall through which the filtered air can pass. An evaporator bypass 862 allows all or some of the filtered air to bypass the evaporator 860, and a bypass damper 880 is opened to allow 100% bypass of the evaporator 860, in which case the evaporator damper 890 is then fully closed. Filtered air can also be partially bypassed, or all go through the evaporator 860, depending on the percentage opening of each of the dampers 880 and 890.

Also within the air cooling area 830 is a fan 870, shown as a fan array of multiple fans, operable to push the filtered air through the air cooling area 830, as well as an outlet damper 880 controllable by an actuator and operable to control an amount of the cooled air delivered from the air cooling area 830.

As shown and mentioned previously the heat exchange unit 900 is contained within a first housing, and the condenser unit 800 is contained within a second housing.

Furthermore, and with reference to FIG. 10, overall air conditioning system for the data center 500 includes a control system 1000. The control system 1000 contains an air handling unit (AHU) and power control system computer 1100, which is operable to automatically control each of the exhaust fan 910, the return damper actuator, the outside air damper actuator, the condenser 842, the bypass damper actuator, the fan 870, and the outlet damper actuator.

Air Handling Control System

As referenced previously, and shown explicitly in FIG. 10, the data center 580 includes a control system 1000. The control system includes an air handling unit (AHU) and power control system (PCS) computer 1100, which as shown obtains signals from many different units, and sends signals to many different units, based upon various software routines run by the AHU/PCS computer 1100. These routines can be integrated with each other, as well as be discrete modules which operate on their own, or a combination of both.

A significant aspect of the present invention is the placement of sensors that can monitor for each/all of temperature, pressure differential, airflow, and humidity. Sensors that monitor these different aspects are placed in different locations throughout the data center.

In particular, having temperature sensors inside the thermal shield 400 (preferably redundant ones at the two ends and the middle of the cluster at least), and at different levels (such as at the middle and top of a cabinet 110, as well as at the middle and top of the thermal shield 400), as well as in stratified locations in the gap between the false ceiling 140 and the actual ceiling 150 (spaced at intervals of between 2-4 feet, as well as outside the thermal shield area, at the outside of cabinets in the cold aisles, allows for precise temperature gradient information throughout the facility.

Humidity sensors are helpful to have at locations that are the same as the temperature sensors, though fewer are needed, as humidity data need not be as precise for overall control of the building thermal environment.

Pressure differential sensors are also preferably located, redundantly, in a number of different areas. These include within the thermal shield below the false ceiling 140, outside the thermal shield below the false ceiling 140, at different locations in the gap between the false ceiling 140 and the actual ceiling 150 (spaced at intervals of between 2-4 feet), at various locations within the cold aisle ducts 310, particularly a header plenum that has a main cold air area to which many of the different condenser units connect, shown best along 310-I in FIG. 5B2 and then distribute cool air to the cooling ducts 310 that form the cold aisles. This allows for sensing of the pressure at various locations, and in particular within the hot air containment chamber 210, outside the hot air containment chamber 210 above the cabinets 110, within the gap between the false ceiling and the actual ceiling 150, and within the cold aisle ducts. This allows for modification of the air handing units 800/900 by the control system 1100. Overall pressure control between the hot air containment chamber 210, the cold aisle, and the gap between the false ceiling and the actual ceiling 150 is achieved by adjusting the air handling units 800/900 so that the pressure is maintained in these different areas within a predetermined range of each other, for example. This also allows for running the facility at a positive pressure differential when outside air is used, at ranges of 1% to 6%, such that as in essence the building breathes out.

Airflow sensors are also preferably located in each of the areas where the pressure differential sensors are noted as being required, in order to ensure that the airflow is stable, as amounts of airflow that are too great, just as pressure differentials that are too great, can adversely affect the electronic equipment.

Areas where these differentials occur the most in the embodiments described herein are at the barrier caused by the thermal shield 400 within each cabinet cluster 590, between the false ceiling and the gap thereover, since heated air from each of the different hot aisle areas 210, associated with each cabinet cluster 590, vent to this large gap area.

Signals from these sensors, as shown by Temperature, Pressure Differential, Airflow, and Humidity Sensor Control and input/output (1/0) signals (block 1310) can then be used to provide damper actuator control (block 1320), VFD fan control and 1/0 signals (block 1330), evaporator control and 1/0 signals (block 1340), condenser control and 1/0 signals (block 1350), evaporator control and 1/0 signals (block 1360), and optionally chiller control and 1/0 signals (block 1370). Within the Damper actuator control block is included the dampers associated with the cold aisle ducts, which dampers can be automatically adjusted to fully open, fully closed, or in-between amounts based upon sensing of the current conditions, as described previously.

Still furthermore, the AHU/PCS computer 1100 also monitors power consumption and power production, depending on the devices, to assess overall power usage. As such, electrical energy monitor sensors within the RPP 180 are operated upon by the RPP control and 1/0 signals block 1410, and provide an indication of the power usage of the electronics devices in the cabinets The PDU 598 is monitored, as is known, and operated upon by the PDU control and 1/0 signals block 1420. Power load control and 1/0 signals block 1430 provides monitoring of the transformers and uninterruptable power supplies within the distribution area 584. Backup generator control and 1/0 signals block 1440 is used for the control of the backup generator 594, whereas telecommunication control and 1/0 signals block 1450 is used for the control of the telecommunications equipment. Equipment load control and 1/0 signals block 1460 controls and monitors energy consumption of other equipment within the data center facility.

The above control blocks can contain software written to both act upon input signals obtained from other sensors or other units, and ensure that the various different units operate together. The usage of the term 1/0 signals is intended to convey that for any of the associated sensors, actuators for dampers, VFD for fans, and other mechanisms, that depending on the model used, such devices may output signals, input signals or both.

It is also noted that what occurs with one device will alter which other devices operate. Thus, for example malfunction of a particular circuit in an RPP 180 will cause the AHU/PCS computer 1100 to switch over to the redundant circuit in the same RPP 180 until that circuit is fixed.

It is particularly noted that the above system can monitor and control for certain situations that are particularly significant for data centers. For example, the air flow patterns that are caused, with the inclusion of the false ceiling 140 as shown in FIG. 1C, require assessment of high and low pressure areas. The AHU/PCS computer 1100 can monitor for this, and as a result maintain a balance, thus ensuring that fans and other components that are within the electronics equipment stored in the cabinets 110 isn't damaged.

Also shown in FIG. 10 are building cabinet cluster and cage lock sensors block 1510. This allows for the detection of which cabinet clusters 590, as well as which cabinets 110, are open, based upon sensors that are placed at each of these areas.

Fire and roof water detection leak sensors module 1520 is also shown, as this can be used in conjunction with known systems, and interfaced with the other blocks referred to herein, to ensure that if a fire or leak is detected, that appropriate shut down of equipment in the preferred sequence to avoid damage is done.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures.

What is claimed is:

1. A facility for maintaining electronic equipment at a cool temperature, the facility comprising:
   a plurality of cabinet clusters, each cabinet cluster comprising a plurality of cage cabinets positioned in a back-to-back configuration in two separated rows defining a hot aisle therebetween, the cage cabinets housing electronic equipment that emits heat towards the hot aisle, and the plurality of cabinet clusters being disposed in a cabinet array defining at least one common cold aisle between cabinet clusters of the plurality of cabinet clusters, the at least one common cold aisle being parallel and aligned with the hot aisle, air flow within the facility being directed to pass into the at least one cold aisle, over the electronic equipment, into the hot aisle, and into a hot air exhaust area disposed at least partially between a false ceiling of the facility and an actual ceiling of the facility;
   a security perimeter surrounding the plurality of cabinet clusters, the perimeter comprising:
      an interior wall formed from first panels, the first panels being configured to allow air to flow therethrough, the interior wall extending from a floor of the facility to the false ceiling;
      a second wall formed from second panels, the second panels being configured to allow air to flow therethrough, the second panels being aligned with the first panels to prevent a view of the cabinet clusters from outside the perimeter, the second wall extending from the floor of the facility to the false ceiling, wherein the interior wall is spaced apart from and does not engage the second wall.

2. The facility of claim 1, wherein the first panels comprise first apertures to allow air to flow therethrough.

3. The facility of claim 2 wherein the first apertures are formed in at least one first hole array on the first panels.

4. The facility of claim 3, wherein the at least one first hole array has a rectangular shape.

5. The facility of claim 4, wherein the rectangular shape extends horizontally.

6. The facility of claim 3, wherein the second panels comprise second apertures to allow air to flow therethrough, and the second apertures are formed in at least one second hole array on the first panels.

7. The perimeter of claim 6, wherein the second panels are aligned with the first panels so that the at least one second hole array does not overlap with the at least one first hole array, preventing a view of the cabinet cluster from outside the perimeter.

8. A perimeter for a cabinet cluster storing electronic devices in a facility, the perimeter comprising:
   an interior wall formed from first panels, the first panels having one or more first panel apertures configured to allow air to flow therethrough, the interior wall extending from a floor of the facility to a ceiling of the facility such that a hot air exhaust area is disposed above the ceiling;
   a second wall formed from second panels, the second panels having one or more second panel apertures to allow air to flow therethrough, the second panel apertures not aligned with the first panel apertures to prevent a view of the cabinet cluster from outside the perimeter, the second wall extending from the floor of the facility to the ceiling of the facility, wherein the interior wall is spaced apart from and does not engage the second wall.

9. The perimeter of claim 8 wherein the first panel apertures are formed in at least one first hole array on the first panels and the second panel apertures are formed in at least one second hole array on the second panels.

10. The perimeter of claim 9, wherein the at least one first hole array has a rectangular shape.

11. The perimeter of claim 10, wherein the rectangular shape extends horizontally.

12. The perimeter of claim 8, wherein the first panels and second panels extend from a floor to a ceiling.

13. The perimeter of claim 9, wherein the second panels are aligned with the first panels so that the at least one second hole array does not horizontally overlap with the at least one first hole array, preventing a view of the cabinet cluster from outside the perimeter.

14. The perimeter of claim 8, wherein the perimeter is rectangular shaped and generally parallel to the cabinet cluster.

15. The perimeter of claim 8, wherein the view is a direct line of sight from outside the perimeter to inside of the perimeter.

16. The perimeter of claim 13, wherein the view is a direct line of sight from outside the perimeter to inside of the perimeter.

17. The perimeter of claim 9, wherein the at least one first hole array is hexagonal to form a honeycomb shape in the array.

18. The perimeter of claim 8, wherein the perimeter entirely surrounds the cabinet cluster.

19. The perimeter of claim 8, wherein the interior wall and exterior wall comprises lockable fencing to permit access to an interior of the perimeter.

* * * * *